(12) United States Patent
Sassler et al.

(10) Patent No.: US 12,047,049 B2
(45) Date of Patent: Jul. 23, 2024

(54) FILTER THAT MINIMIZES IN-BAND NOISE AND MAXIMIZES DETECTION SENSITIVITY OF EXPONENTIALLY-MODULATED SIGNALS

(71) Applicant: DYNASPOT CORP., Fort Pierce, FL (US)

(72) Inventors: Marvin L. Sassler, Fort Pierce, FL (US); Alan T. Sassler, Fort Pierce, FL (US)

(73) Assignee: DYNASPOT CORP., Fort Pierce, FL (US)

( * ) Notice: Subject to any disclaimer, the term of this patent is extended or adjusted under 35 U.S.C. 154(b) by 0 days.

(21) Appl. No.: 18/116,047

(22) Filed: Mar. 1, 2023

(65) Prior Publication Data

US 2023/0208401 A1 Jun. 29, 2023

Related U.S. Application Data

(60) Division of application No. 17/333,931, filed on May 28, 2021, now Pat. No. 11,621,701, which is a
(Continued)

(51) Int. Cl.
*H03H 17/02* (2006.01)
*H03D 3/26* (2006.01)
(Continued)

(52) U.S. Cl.
CPC .......... *H03H 17/0254* (2013.01); *H03D 3/26* (2013.01); *H03H 7/06* (2013.01);
(Continued)

(58) Field of Classification Search
CPC ................................................. H03H 17/0254
(Continued)

(56) References Cited

U.S. PATENT DOCUMENTS 3,525,946 A   8/1970 Grace
3,810,018 A * 5/1974 Stover .................. H04B 14/006
                                                        329/346
(Continued)

OTHER PUBLICATIONS

International Search Report for related PCT Application No. PCT/US2015/021675 dated Jun. 22, 2015.
(Continued)

*Primary Examiner* — Lihong Yu
(74) *Attorney, Agent, or Firm* — Caesar Rivise, PC

(57) ABSTRACT

Trans-filter/Detectors are extremely sensitive circuits that recover exponentially modulated signals buried in noise. They can be used wherever Matched Filter/Coherent Detectors are used and operate at negative input signal-to-noise ratios to recover RADAR, SONAR, communications, or data signals, as well as reduce phase noise of precision oscillators. Input signal and noise is split into two paths where complementary derivatives are extracted. Outputs of the two paths are equal in amplitude and 180 degrees relative to each other at the band center frequency. The outputs are summed, causing stationary in-band noise to be reduced by cancellation while exponentially modulated signals are undiminished. Trans-filters are Linear Time Invariant circuits, have no noise x noise threshold and can be cascaded, increasing output signal-to-noise ratio prior to detection. Trans-filters are most sensitive to all types of digital modulation, producing easily detected polarized pulses synchronous with data transitions. Trans-filters do not require coherent conversion oscillators and complex synchronizing circuits.

6 Claims, 36 Drawing Sheets

Related U.S. Application Data continuation-in-part of application No. 16/404,054, filed on May 6, 2019, now Pat. No. 11,025,230, which is a continuation-in-part of application No. 15/876,910, filed on Jan. 22, 2018, now Pat. No. 10,320,365, which is a continuation-in-part of application No. 15/127,472, filed as application No. PCT/US2015/021675 on Mar. 20, 2015, now Pat. No. 9,941,862.

(60) Provisional application No. 61/968,453, filed on Mar. 21, 2014.

(51) Int. Cl.
  *H03H 7/06* (2006.01)
  *H04B 1/16* (2006.01)

(52) U.S. Cl.
  CPC .... *H03H 17/0219* (2013.01); *H03H 17/0267* (2013.01); *H04B 1/1638* (2013.01); *H03D 2200/0054* (2013.01)

(58) Field of Classification Search
  USPC .......................................................... 375/343
  See application file for complete search history.

(56) References Cited

U.S. PATENT DOCUMENTS

| | | | |
|---|---|---|---|
| 3,876,939 A | 4/1975 | Lerner | |
| 4,023,166 A | 5/1977 | Marshall | |
| 4,388,595 A * | 6/1983 | Brooks | H03D 3/006 329/343 |
| 6,002,298 A | 12/1999 | Noga | |
| 6,539,202 B1 * | 3/2003 | Yamashita | H04B 1/109 455/24 |
| 9,941,862 B2 | 4/2018 | Sassler et al. | |
| 10,320,365 B2 | 6/2019 | Sassler et al. | |
| 2001/0043656 A1 | 11/2001 | Koslar et al. | |
| 2005/0001761 A1 | 1/2005 | Kliewer et al. | |
| 2006/0274641 A1 | 12/2006 | Grieco et al. | |
| 2011/0106541 A1 | 5/2011 | Ekstrand et al. | |
| 2013/0343587 A1 * | 12/2013 | Naylor | H04R 25/45 381/318 |
| 2019/0260357 A1 | 8/2019 | Sassler et al. | |

OTHER PUBLICATIONS

Davenport, "Signal-to-Noise Ratios in Bandpass Limiters", Massachusetts Institute of Technology, Research Laboratory of Electronics, Technical Report No. 234, May 29, 1952.

Zhao, et al., "A Modified Modulation Recognition Method Against Doppler Effects", Information Technology Journal, vol. 10, Issue 4, pp. 825-832, 2011.

\* cited by examiner

FILTER THAT MINIMIZES IN-BAND NOISE AND MAXIMIZES DETECTION SENSITIVITY OF EXPONENTIALLY-MODULATED SIGNALS

CROSS-REFERENCE TO RELATED APPLICATIONS

This Divisional Application claims benefit under 35 U.S.C. § 121 of application Ser. No. 17/333,931 filed on May 28, 2021, which is a Continuation-in-Part Application and claims the benefit under 35 U.S.C. § 120 of application Ser. No. 16/404,054 filed on May 6, 2019, which in turn is a Continuation-in-Part Application and claims the benefit under 35 U.S.C. § 120 of application Ser. No. 15/876,910 (now U.S. Pat. No. 10,320,365) filed on Jan. 22, 2018, which in turn is a Continuation-in-Part Application and claims the benefit under 35 U.S.C. § 120 of application Ser. No. 15/127,472 (now U.S. Pat. No. 9,941,862) filed on Sep. 20, 2016, which in turn is a U.S. National Phase Application and claims the benefit under 35 U.S.C. § 371 of International Application No. PCT/US2015/021675 filed on Mar. 20, 2015, all of which are entitled FILTER THAT MINIMIZES IN-BAND NOISE AND MAXIMIZES DETECTION SENSITIVITY OF EXPONENTIALLY-MODULATED SIGNALS, and which in turn claims the benefit under 35 U.S.C. § 119(e) of Provisional Application Ser. No. 61/968,453 filed on Mar. 21, 2014 entitled TRANS FILTER and all of whose entire disclosures are incorporated by reference herein.

BACKGROUND OF THE INVENTION

The present invention relates generally to devices that recover, detect or demodulate signals, and more particularly, to devices that provider greater sensitivity and noise rejection for the detection of FM, Doppler radar, geological or oceanographic sonar returns and for spread spectrum communication or hybrid envelope/exponent modulation systems.

Conventional FM detectors/demodulators suffer from a threshold phenomenon which limits detection sensitivity of exponentially modulated signals (also referred to as "angle modulated signals"). These detectors/demodulators typically utilize diode rectifiers and matched filters to recover the baseband information signals. However, such devices introduce non-linearities, e.g., noise cross products that are the root cause of the threshold phenomenon.

As predicted by Claude Shannon, an FM demodulator is 1.77 dB more sensitive than a matched filter of equal bandwidth. Under this paradigm, the best that can be achieved by using the matched filter is an output signal-to-noise ratio (SNR) that is equal to the input carrier-to-noise ratio (CNR).

In particular, the current state-of-the-art in analog demodulators or detectors of exponentially modulated signals can be categorized into several broad classes. The first major class distinction considers the treatment of additive white Gaussian noise (AWGN). There are methods that convert or transform stationary AWGN to a parabolic noise density distribution and those that do not. Those that do convert AWGN to a parabolic distribution all have a CNR threshold limitation below which the conversion ceases. Foster-Seely, Travis and Ratio Detector types of exponential modulation demodulators, detectors or discriminators are the primary types that perform the conversion when operating at (C/KT) above the threshold limitation. See FIGS. 1A and 1B which depict a Travis FM discriminator and a Foster-Seeley discriminator, respectively.

Another general class of exponential modulation detectors utilize some form of product detection. This class of detectors do not convert AWGN to a parabolic noise power distribution. At best, they do not degrade the output detected signal-to-noise-ratio to a value worse than the input (CNR) or (C/KTB) where the input and output bands are equal. Among this type of detector is the Phase Locked Loop, the correlation detector. The Phase Locked Loop uses a voltage controlled oscillator (VCO) to provide a replica of the received signal. The phase error between the received signal and the VCO provides the signal that drives the VCO. It can have a threshold that is about 3 dB better that of the Foster-Seeley or Travis Demodulator.

Other types of exponential modulation detectors are:
1. Pulse Counting Discriminator. This method uses a monostable multivibrator or other pulse generator that produces a pulse of constant amplitude and width each time the composite noise and signal voltage crosses a reference value. The output pulses are low pass filtered to reject the pulse repetition rate. Fluctuation of the average value of the LP Filter output is the baseband information. This type of demodulator has a high threshold and is seldom used.
2. The FMFB utilizes negative feed-back to compress the received spectrum prior to demodulation. This technique is effective for small information bandwidths and has been used to carry up to 600 telephone channels on a single FDMFM carrier. The threshold improvement is of the order of 3 dB.
3. I/Q Demodulators. This class of demodulator requires a high degree of synchronization with the transmitted signal. The received signal is broken down into In Phase and Quadrature components. The multipliers or mixers used to perform the conversion do not transform flat input noise density to parabolic and so are limited to matched filter performance. However, there is no threshold if the band can be made small enough. Using this type of detector with a 1 Hz bandwidth the signal and noise can be sampled and stored. Multiple samples can be processed to effectively decrease the bandwidth and increase (SNR). This technique is used to detect weak Doppler RADAR returns.

Therefore, in view of the foregoing, all of these conventional demodulators fail to address the CNR threshold and, as a result, at or below this threshold the output signal is pure noise. Furthermore, because these configurations are demodulators, they do not operate as filters and consequently these demodulators cannot be cascaded.

Thus, there remains a need to overcome this threshold phenomenon by using filtering techniques which permit the cascading of stages thereof, that improves the SNR and which eliminates the need to utilize complex techniques to result in improved performance and design simplification and which provides a circuit that exhibits a negative noise figure. Moreover, there remains a need for a device and method for reducing the phase noise of a precision oscillator.

All references cited herein are incorporated herein by reference in their entireties.

BRIEF SUMMARY OF THE INVENTION

A system that demodulates an exponentially-modulated signal by minimizing noise in a signal band of the exponentially-modulated signal while maximizing a detection sensitivity is disclosed. This system results in a negative noise figure defined by a ratio of input signal-to-noise ratio (SNRi) to an output signal-to-noise ratio (SNRo) that is less than one.

A method for demodulating an exponentially-modulated signal by minimizing noise in a signal band of the exponentially-modulated signal while maximizing a detection sensitivity is disclosed. This method generates a negative noise figure defined by a ratio of an input signal-to-noise ratio ($SNR_i$) to an output signal-to-noise ratio ($SNR_o$) that is less than one.

A phase noise reduction system for reducing the phase noise of a precision oscillator having an oscillator output signal having a frequency ($F_O$) and comprising residual amplitude modulated (AM) noise and residual phase noise is disclosed. The system comprises: a filter which takes an input signal with noise and splits this input signal into two paths where complimentary derivatives are extracted and wherein outputs of the two paths, which are equal in amplitude and 180 degrees out of phase at the oscillator output signal frequency ($F_O$), are summed causing stationary in-band noise to be reduced by cancellation to form a filtered output, wherein the filter hereinafter is referred to as a trans-filter and the filtered output is referred to as a trans-filter output; an auto-tuning circuit that continuously tunes the trans-filter to the oscillator output signal frequency ($F_O$); a phase modulator into which the oscillator output signal is fed, wherein the phase modulator modulates the oscillator output signal based on a feedback signal to form a phase modulated output signal; wherein the phase modulated output signal is fed to the trans-filter to form said input signal with noise, wherein the input signal with noise corresponds to the oscillator output signal with residual AM noise and residual phase noise, and wherein the phase modulated output signal also is fed to a 90° phase shifter to form a 90° shifted phase modulated output signal; a multiplier for multiplying the trans-filter output with the 90° shifted phase modulated output signal to form a multiplier output; a low pass filter for filtering the multiplier output that corresponds to the oscillator output signal with the residual AM noise removed and the residual phase noise remaining therein to form the feedback signal, wherein the feedback signal is fed back to the phase modulator to reduce the residual phase noise of the precision oscillator.

A phase noise reduction system for reducing the phase noise of a precision oscillator having an oscillator output signal having a frequency ($F_O$) and comprising residual amplitude modulated (AM) noise and phase noise is disclosed. The system comprises: a filter which takes an input signal with noise and splits this input signal into two paths where complimentary derivatives are extracted and wherein outputs of the two paths, which are equal in amplitude and 180 degrees out of phase at the oscillator output signal frequency ($F_O$), are summed causing stationary in-band noise to be reduced by cancellation to form a filtered output, wherein the filter hereinafter is referred to as a trans-filter and the filtered output is referred to as a trans-filter output; an auto-tuning circuit that continuously tunes the trans-filter to the oscillator output signal frequency ($F_O$); the oscillator output signal being fed to the trans-filter and to a 90° phase shifter, wherein the input signal with noise corresponds to the oscillator output signal with residual AM noise and residual phase noise and wherein an output of said 90° phase shifter comprises the oscillator output signal with residual AM noise and residual phase noise shifted by 90°; a multiplier for multiplying the trans-filter output with the oscillator output signal with residual AM noise and residual phase noise shifted by 90° to form a multiplier output; a low pass filter for filtering the multiplier output that corresponds to the oscillator output signal with the residual AM noise removed and the residual phase noise remaining therein to form a feed forward signal; and a phase modulator for receiving the oscillator output signal with residual AM noise and residual phase noise shifted by 90° and receiving said feed forward signal, said phase modulator modulating said oscillator output signal with residual AM noise and residual phase noise shifted by 90° with said feed forward signal to reduce the phase noise of the precision oscillator.

BRIEF DESCRIPTION OF SEVERAL VIEWS OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE PREFERRED EMBODIMENTS

Figure 1A:
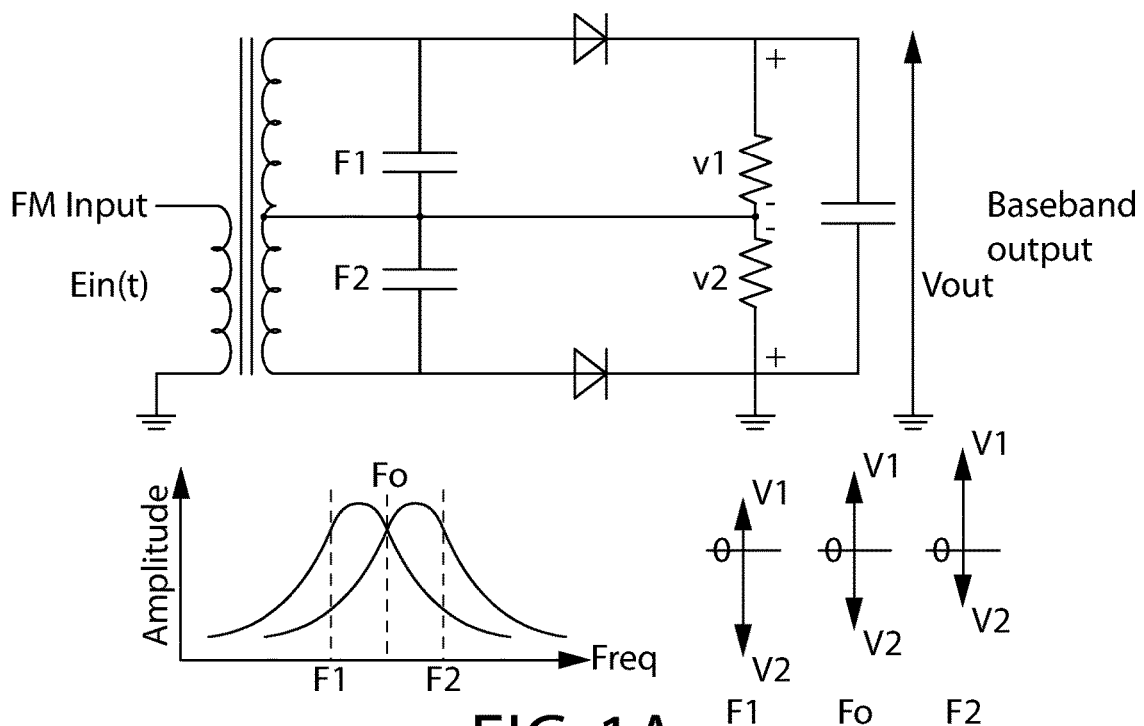
FIG. 1A is a prior art demodulator, viz., Travis FM discriminator along with its frequency and signal characteristics, that operates above the CNR threshold.
Figure 1B:
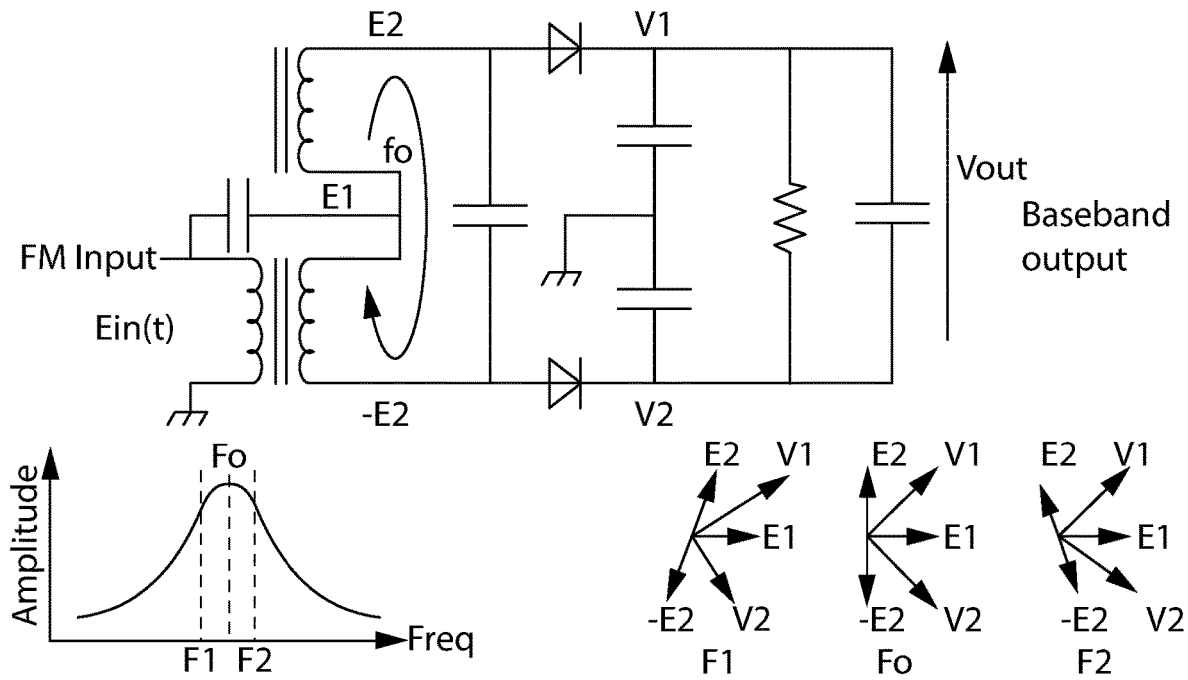
FIG. 1B is another example of a prior art demodulator, viz., Foster-Seeley discriminator along with its frequency and signal characteristics, that operates above the CNR threshold.

Referring now to the figures, wherein like reference numerals represent like parts throughout the several views, exemplary embodiments of the present disclosure will be described in detail. Throughout this description, various components may be identified having specific values, these values are provided as exemplary embodiments and should not be limiting of various concepts of the present invention as many comparable sizes and/or values may be implemented.

The trans-filter 20 minimizes in-band noise and maximizes detection sensitivity of exponentially-modulated signals 20 by eliminating the threshold phenomenon that limits detection sensitivity of exponentially modulated signals (also referred to as "angle modulated signals"). It accomplishes this by elimination of nonlinear circuit elements (e.g., diodes, transistors, non-linear magnetics, etc.) used in conventional exponential modulation detectors such as phase or frequency discriminators. As such, the trans-filter 20 is linear time-invariant (LTI). The networks used in the trans-filter 20 meet the criteria of LTI, namely, that (1) the output is linearly related to the input and (2) the output for a particular input does not change due to the presence of other signals.

The filter 20 is a LTI circuit that detects or demodulates a variety of different modulation formats. It differentiates the input signal and transforms in-band stationary AWGN to a parabolic noise density distribution. The outputs of two parallel frequency selective circuits with opposite amplitude vs. frequency slopes are subtracted. Stationary noise components above and below the center frequency cancel each other, resulting in the parabolic noise density distribution. The magnitude of the transfer function is a "V-shaped" slope across the bandwidth of the filter reaching zero as the center frequency. The phase of the transfer function abruptly changes by 180° at the center frequency. Rapid amplitude, phase or frequency variations in the input signal generate impulses at the trans-filter 20 output. Differentiation of the input signal extracts the baseband spectrum from the RF (radio frequency) or carrier portion of the signal. The baseband, carrier and noise spectral lines all appear at the output in their respective bands. Since all of the components that comprise the trans-filter 20 are linear, there is no multiplicative reaction between any of the spectral lines. This is the reason that there is no threshold associated with the trans-filter 20. Since the frequency spectra of the baseband, carrier and noise all exist at the output of the trans-filter, but in their respective bands, they can be separated by judicious filtering. Because flat stationary noise at the input is transformed by the linear slope into a parabolic noise density distribution and the power of an exponentially modulated signal increases as the square of the deviation, the output SNR is increased by the well-known FM improvement equation:

Output SNR in $f_m = P_S/P_N = (3/2)(C/KTf_m)(\Delta F/f_m)^2$   (Equation #1)

where:
$P_S$=signal power and $P_N$=noise power;
C=input carrier signal power;
K=Boltzman's Constant;
T=Noise temperature in degrees K;
$f_m$=highest frequency in modulated signal=B;
$\Delta F$=frequency deviation.
Equation #1 can be rewritten as:

Output SNR=$(3/2)(C/KTB)(\Delta F/B)^2$=$(3/2)(CNR)(\Delta F/B)^2$ (Equation #2)

where (C/KTB)=input (CNR) in the information band B. The trans-filter 20 provides FM improvement without the threshold limitation of conventional FM demodulators. This results in a more sensitive radio wave detector that can operate in noisier environments and with much weaker signals than any other currently-used devices. The sensitivity of this device is greater than that of the "matched filter" by the factor $(3/2)(\Delta F/B)^2$, known in the industry as the "FM Improvement Factor." In contrast, the quantity C/KTB is also the optimum SNR or the best that can be achieved with a matched filter. Thus, in conventional devices/methods, the best performance is given by:

Output $SNR_{matched\ filter}$=Input CNR.

As will also be discussed below, a plurality of identical trans-filters 20 can be cascaded, with each one providing additional rejection of in-band noise while passing exponentially-modulated signals undiminished. For FSK (frequency-shift keying), BPSK (binary phase shift keying) and PAM (pulse amplitude modulation) and other exponentially modulated signals, cascading trans-filters produces increasingly large impulses at the signal transitions. The fundamental frequency of the transients occur at baseband and can be recovered without additional frequency conversion or synchronization. In addition, the transients, having a large peak to average ratio, are even more easily detected. Doppler and data rate information may also be obtained from the impulses, thereby simplifying the demodulation process.

The trans-filter 20 may be used to provide superior reception in a multitude of applications such as digital FM broadcast of voice or music, digital data, GPS, radar, sonar, medical imaging, geographical mapping, and oil/mineral exploration, by way of example only.

The trans-filter 20 accomplishes this by using LTI frequency or phase sensitive networks that produce outputs that maintain a 180 degree phase relationship relative to each other over the exponential modulation band. The frequency sensitive network outputs can then be summed to produce an output whose amplitude is proportional to frequency or phase deviation of the input signal. Hybrid signal modulation methods utilizing both amplitude modulation (AM) and phase modulation (PM) can also benefit from the noise rejection characteristics of the trans-filter 20.

It should be noted that the term "filter" as used with regard to the trans-filter 20 is meant by Applicant to describe any implementation of the features associated with the trans-filter 20. Therefore, the term "filter" is not limited to a discrete component design or even an analog design but also includes a solid state/integrated circuit configuration, a digital implementation formed in computer code, or any other manner of implementing the features of the trans-filter 20 as described herein. In addition, the trans-filter 20 can be a module, or a stage(s) in a larger apparatus or device such as, but not limited to, a data or communication receiver, etc. Furthermore, the term "filter" is meant to cover one or more of the trans-filters 20 if a cascade (e.g., at least two trans-filters 20 are coupled together) of these trans-filters 20 is implemented.

Figure 2:
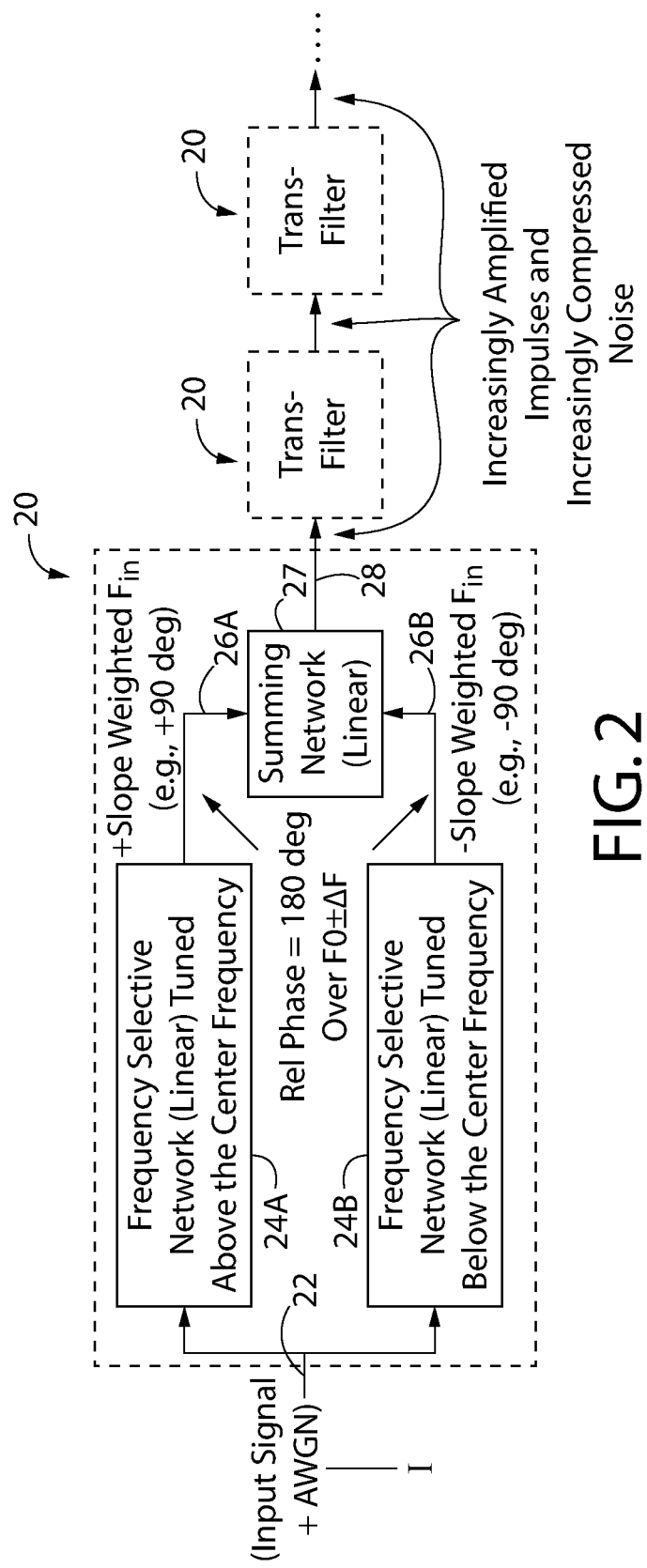
FIG. 2 is a block diagram of the filter invention of the present application, hereinafter referred to as the "trans-filter" and also depicting a plurality of these trans-filters being cascaded for increasing noise compression and impulse amplitude where these impulses are generated at data transitions for many modulation formats.
Figure 3:
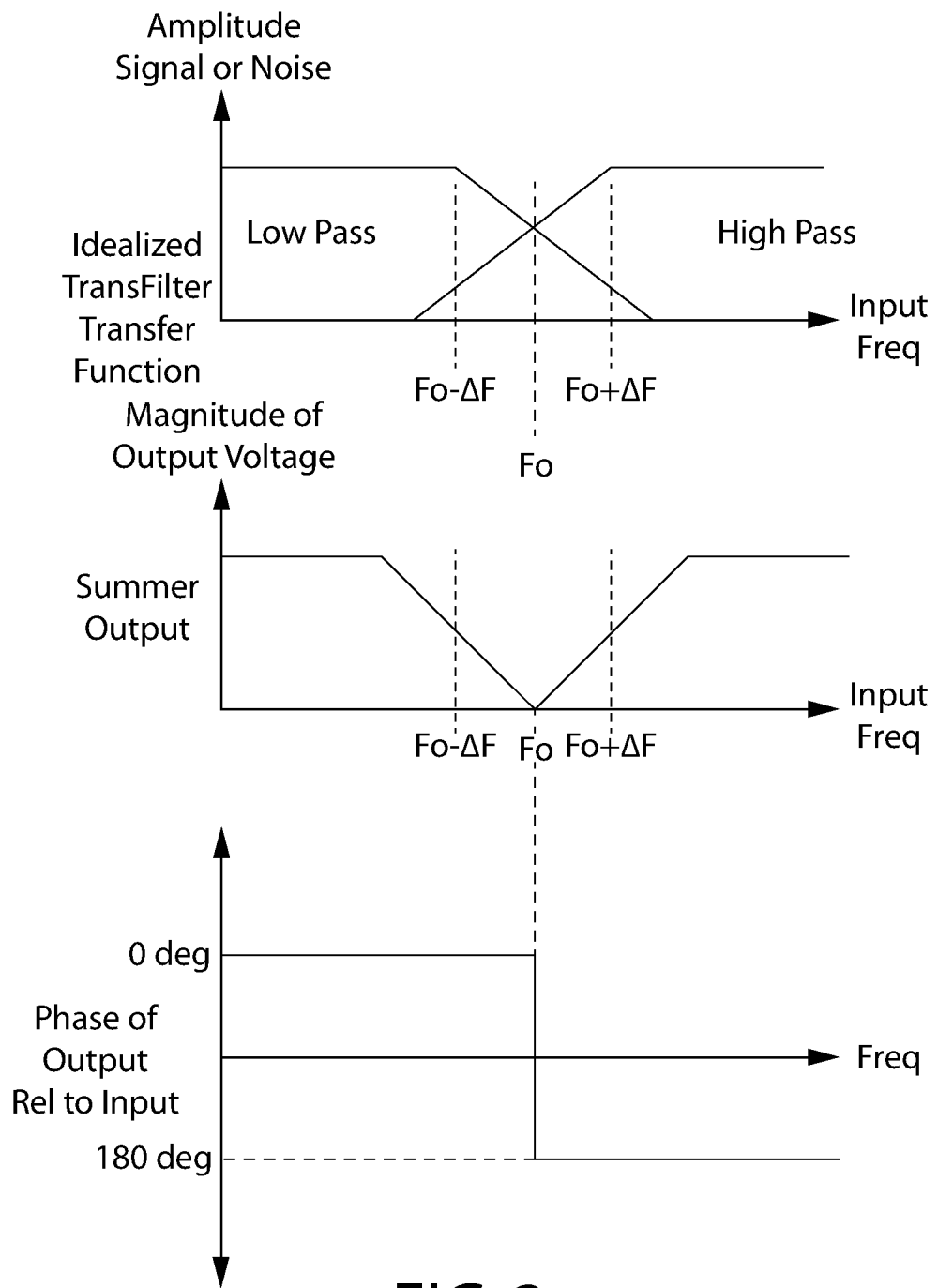
FIG. 3 are respective frequency responses for the signal emanating from the upper frequency selective network, the lower frequency selective network and the signal emanating from the summer.
Figure 6:
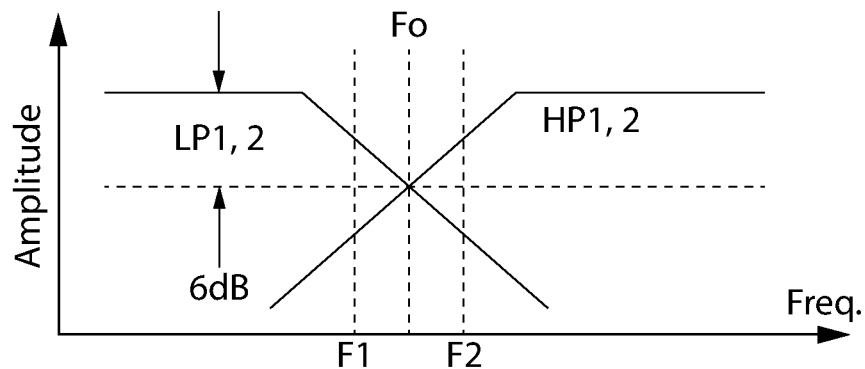
FIG. 6 is the amplitude vs. frequency response of the two high and low pass filters' outputs.

In particular, as shown in FIG. 2, a frequency modulated (FM) signal I, including additive white Gaussian noise (AWGN), is fed into an input 22 to the trans-filter 20. The signal I is simultaneously fed to a frequency selective network 24A that is tuned above the center frequency (e.g., two single high pass filters, or an even number thereof) and a frequency selective network 24B that is tuned below the center frequency (e.g., two single pole low pass filters, or an even number thereof), both of which are linear, to generate respective slope-weighted signals 26A and 26B that are 180° out of phase. Network 24A shifts the phase of FM signal 10 by +90° while network 24B shifts the phase of FM signal 10 by −90°. As the input frequency varies (over $F_0+\Delta F$), the signals 26A and 26B (having respective vector notations, v1 and v2) remain at 180° phase relative to each other. Thus, at the center frequency ($F_0$), the signals 26A and 26B are equal in amplitude and 180° out of phase. See FIGS. 3 and 6-7. These two signals 26A and 26B are then fed to a summing network 27 (also linear), thereby output signal 28 having a zero amplitude at this frequency, $F_0$. This accounts for the linear rejection of stationary noise density voltage that results in parabolic weighting of noise power density over the baseband. The signal deviation is undiminished and therefore the trans-filter 20 reduces only the stationary AWGN.

Figure 7:
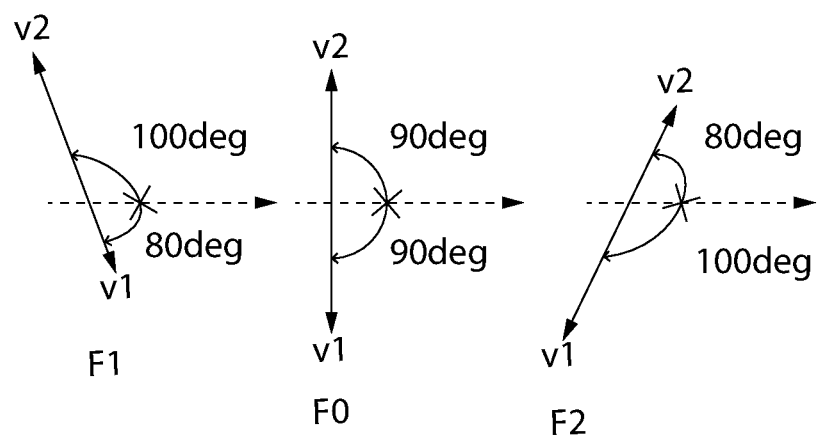
FIG. 7 is a vector diagram showing the amplitude and phase of v1 and v2 vectors at the frequencies $F_1$, $F_0$ and $F_2$ of the trans-filter corresponding to FIGS. 5-6.
Figure 8:
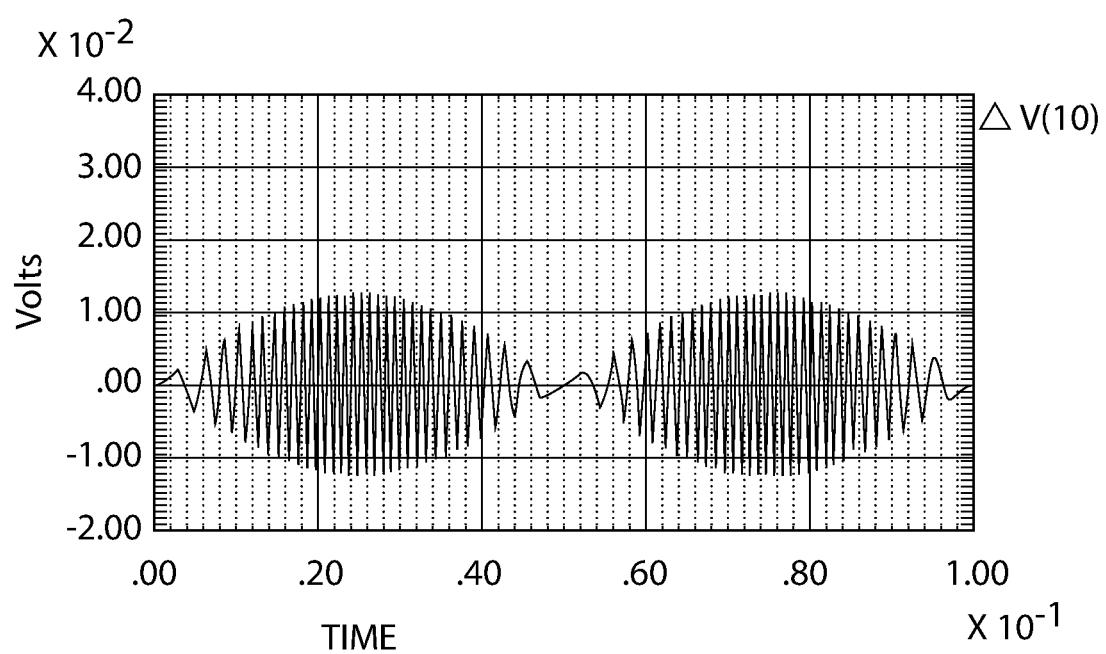
FIG. 8 is a depiction of the carrier envelope at the sum output of the trans-filter.

As mentioned previously, the outputs 26A/26B of the two frequency sensitive networks are summed together at the sum network 27 to produce a single output 28. The sum output 28 has the same instantaneous frequency as the input. The instantaneous amplitude is a function of the frequency offset from the center frequency. The carrier phase at the summer output 28 reverses each time the carrier passes through the center frequency. This gives the output 28 the appearance of a Double Sideband Suppressed Carrier (DSBSC)-like waveform with a frequency modulated carrier inside the envelope. The carrier phase at the sum 28 output is shown in FIG. 7 for a single tone analog FM carrier input.

Figure 4:
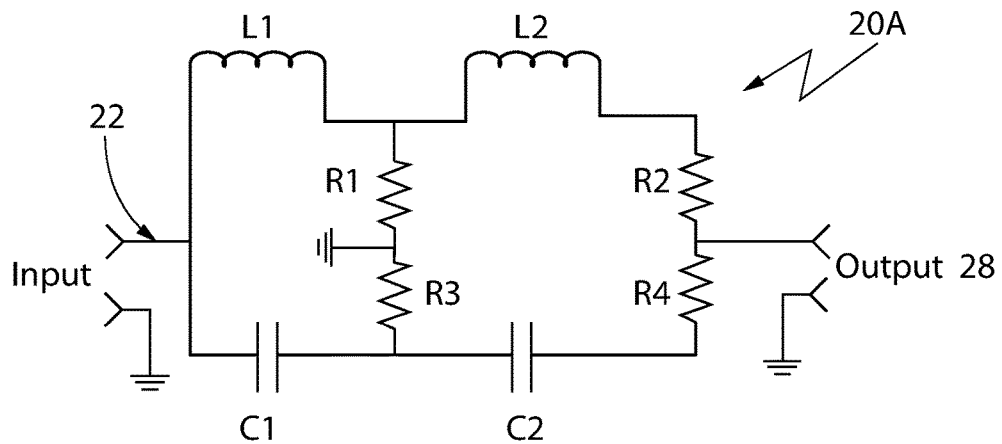
FIG. 4 depicts an exemplary analog version of the trans-filter using two low pass filters in the upper path and two high pass filters in the lower path, where R2 and R4 are both parts of the low pass and high pass filters and the summing network.
Figure 5:
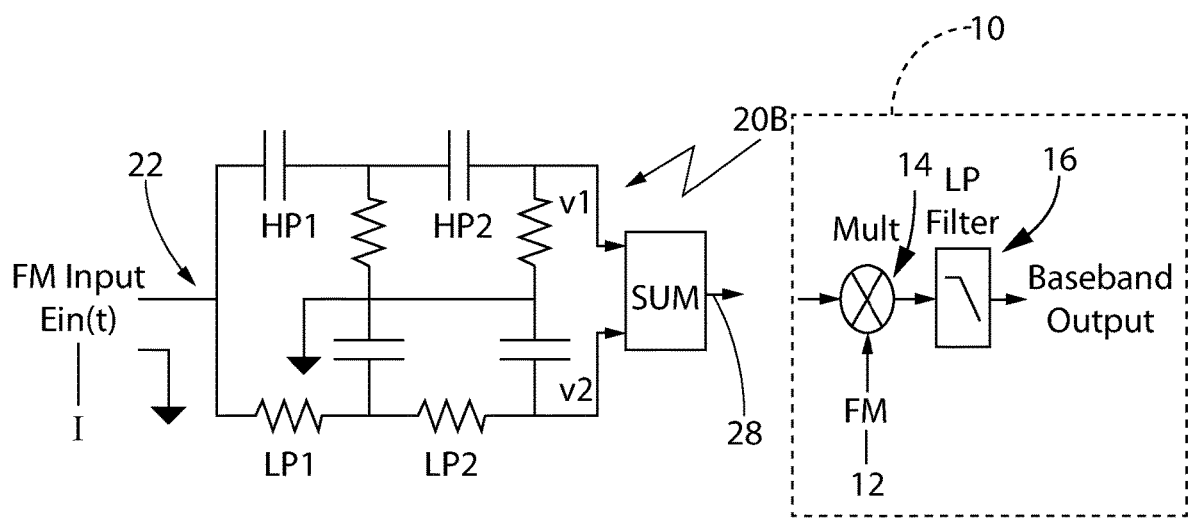
FIG. 5 is another analog version of the trans-filter using two high pass filters and two low pass filters whose 180 degrees-out-phase outputs are then fed to a summer and wherein the summer output, in certain circumstances, may be processed to extract the baseband information.
Figure 9:
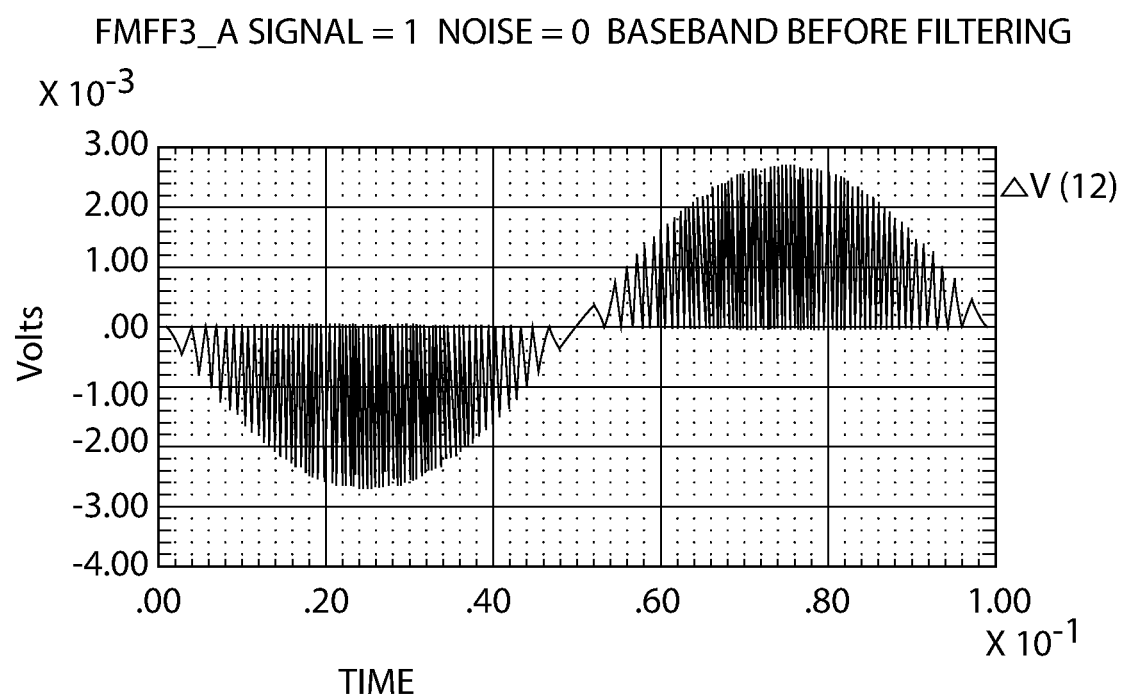
FIG. 9 is timewise depiction of the output multiplier.

FIGS. 4 and 5 provide two exemplary analog embodiments, namely, 20A and 20B, respectively, of the trans-filter 20 and as described previously, because the noise is compressed, the edges of the modulated signal can be easily identified. As a result, there is no need for any conventional demodulation. However, in some circumstances (e.g., in a detector for a Doppler radar, also referred to as a "correlation receiver") the baseband signal may be recovered by using a conventional demodulation stage 10, as shown in FIG. 5; in particular, the demodulation stage 10 multiplies the sum output 28 by a noiseless synchronized replica 12 of the transmitted signal. Furthermore, the multiplier 14 (e.g., product detector) is linear and produces only the sum and difference products of the inputs (see FIG. 9). A low pass filter 16 ejects the carrier and the high order product.

As can be seen from FIGS. 4-5, the frequency selective network tuned above the center frequency 24A may comprise two high pass filters, HP1/HP2 while the frequency selective network tuned below the center frequency 24B may comprise two low pass filter LP1/LP2. The respective output of these two networks are the signals 26A/26B, discussed previously.

It should be further noted that the LTI frequency selective networks 24A/24B may each comprise respective bandpass filters.

Figure 10:
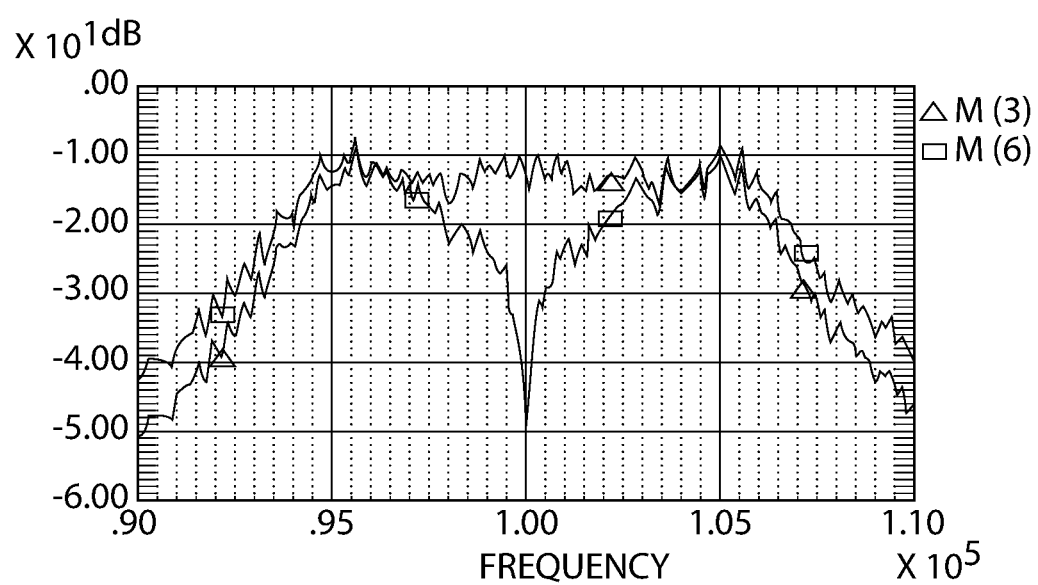
FIG. 10 is a frequency diagram of input and output spectra of the trans-filter, showing the output of the trans-filter having a null at the center frequency even when no carrier, but only noise, is present and demonstrating proof of the linearity (absence the threshold)

As mentioned earlier with regard to the vector diagrams (FIG. 7), the output spectrum of the trans-filter 20 has a null at the center frequency, $F_O$, even when no signal is present. See FIG. 10 where M(3) depicts the input noise spectrum and M(6) depicts the output noise spectrum of a single trans-filter with no signal present. Cascading identical trans-filters 20, as shown in FIG. 2, results in increased noise rejection multiplicatively. The limit is the intrinsic noise of the filter and summing network 27 elements used. Signal transmission through multiple trans-filters 20 is also multiplicative. The resulting distortion can be compensated for by pre-distortion in a fashion similar to pre-emphasis of audio signals in FM Broadcasting. See FIG. 11 which illustrates the additional noise suppression provided by cascading two (by way of example only) trans-filters 20. Thus, a key improvement provided by the trans-filter 20 is cumulative, i.e., cascading trans-filters 20 of equal bandwidth results in increased improvement of signal-to-noise (SNR) ratio. As a result, if one trans-filter 20 provides 20 dB improvement in the SNR, then two identical trans-filters 20 provide 40 dB improvement in SNR. In contrast, cascading "matched filters," of equal bandwidth, produces no additional improvements in SNR.

Cascading trans-filters 20 increases noise rejection, thus increasing the SNR even more relative to a matched filter approach. This can be performed at different intermediate frequencies to avoid having too much gain at any one frequency.

It should be understood that any LTI networks having the properties of 180 degree-relative output phase and linear amplitude variation over the FM band under consideration would allow the cited performance to be achieved. Furthermore, it should be understood that analog representations of the trans-filter 20 of FIGS. 4-5 are provided by way of example only and that digital numeric implementations (also referred to as an "algorithmic representation") of the trans-filter 20 are within the broadest scope of the present invention to provide ideal performance with perfect stability. The digital numeric implementation or algorithmic representation is used to detect or demodulate exponentially modulated signals that have been converted to the digital domain by analog-to-digital converter (ADC).

The trans-filter 20 discriminates against stationary AWGN in the signal band (See FIG. 10), thereby increasing the CNR prior to detection. Unlike any conventional band pass filter (e.g., a (matched filter), a plurality of trans-filters 20 of equal bandwidth can be cascaded, providing additional rejection of stationary AWGN in the pass band (See FIG. 11). The term "signal band" or "in-band" refers to the band occupied by the transmitted signal.

Thus, the foregoing discloses an apparatus and method that eliminates the threshold phenomenon that limits detection sensitivity of exponentially modulated signals. The apparatus and method achieve this by the elimination of nonlinear components and modification of the frequency selective networks to produce a sloping amplitude that is proportional to frequency offset from a center frequency and passes through zero at the center frequency. The opposite sloping amplitude and 180 degree phase difference cause the noise cancellation that transforms flat AWGN to a parabolic shape. The amplitude slope with frequency and the rapid phase reversal at the crossover frequency produce large polarized impulses at the transitions for digitally modulated signals of all types, thereby making the trans-filter 20 a universal digital demodulator. Elimination of non-linear circuit elements, compression of in-band noise and the derivative action of the sloping amplitude vs. frequency characteristic together with the abrupt phase reversal at crossover, combine to produce large polarized impulses at the modulation rate (Baseband) and do not require conversion to baseband. Cascading trans-filters 20 increases the magnitude of the impulse relative to the noise and carrier leakage.

Trans-Filter 20 Impulse Generator/Demodulator

The trans-filter 20 transfer function is basically a frequency domain derivative operator. It generates an output that is a function of the rate of change of the frequency at its input. As a result, the trans-filter 20 generates impulses when the input frequency changes abruptly. This is true for all types of digital modulation, whether it be phase, frequency or even abrupt changes of amplitude such as PAM. The instantaneous reversal of phase of the transfer function when the signal crosses the center frequency of the trans-filter 20 produces polarized impulses that are proportional to the instantaneous frequency change, df/dt, and its sign. For a PAM signal at the trans-filter 20 center frequency, the change in going from off to on is $+F_o$. At the end of the pulse the change is $-F_o$. Either of these changes generate a large enough instantaneous frequency to produce the maximum + or − output of the trans-filter 20. For FSK signals, the output of the first trans-filter 20 is more a sine/cosine conversion rather than an impulse. The second and subsequent trans-filters 20 do produce increasingly large impulses both due to the phase reversal at center frequency and the sharpness of the transition due to the higher order derivative.

While the impulses are generated at the trans-filter output 28 that is centered on $F_o$, their fundamental frequency (viz., the data rate) is at baseband. The trans-filter 20, due to its derivative characteristic, demodulates (viz., converts to baseband) the received signal. Since there are no non-linear components in the trans-filter 20, there is no interaction between any of the frequency components, be they signal or noise. Thus, as discussed previously, there is no threshold phenomenon.

The slope of the trans-filter 20 transfer function converts stationary noise power to a parabolic shape which when integrated over the transmission band relative to the modulation band yields an improvement of [10 log(3/2)+20 log($\Delta$F/B)] for a single unit due to noise reduction only. For two trans-filters 20, the noise reduction improvement is [10 log(5/2)+40 log($\Delta$F/B)]. For N identical trans-filters 20 cascaded, the reduction in noise is [10 log((2N+1)/2)+20N log($\Delta$F/B)]. The increase in signal impulse voltage with each additional stage is more difficult to evaluate since it is highly dependent the form of modulation and upon rise time limitations. The data in FIGS. 20-23 for 4 cascaded stages with a PAM input indicates an increase of approximately 3 dB in signal amplitude for each added stage.

Figure 12:
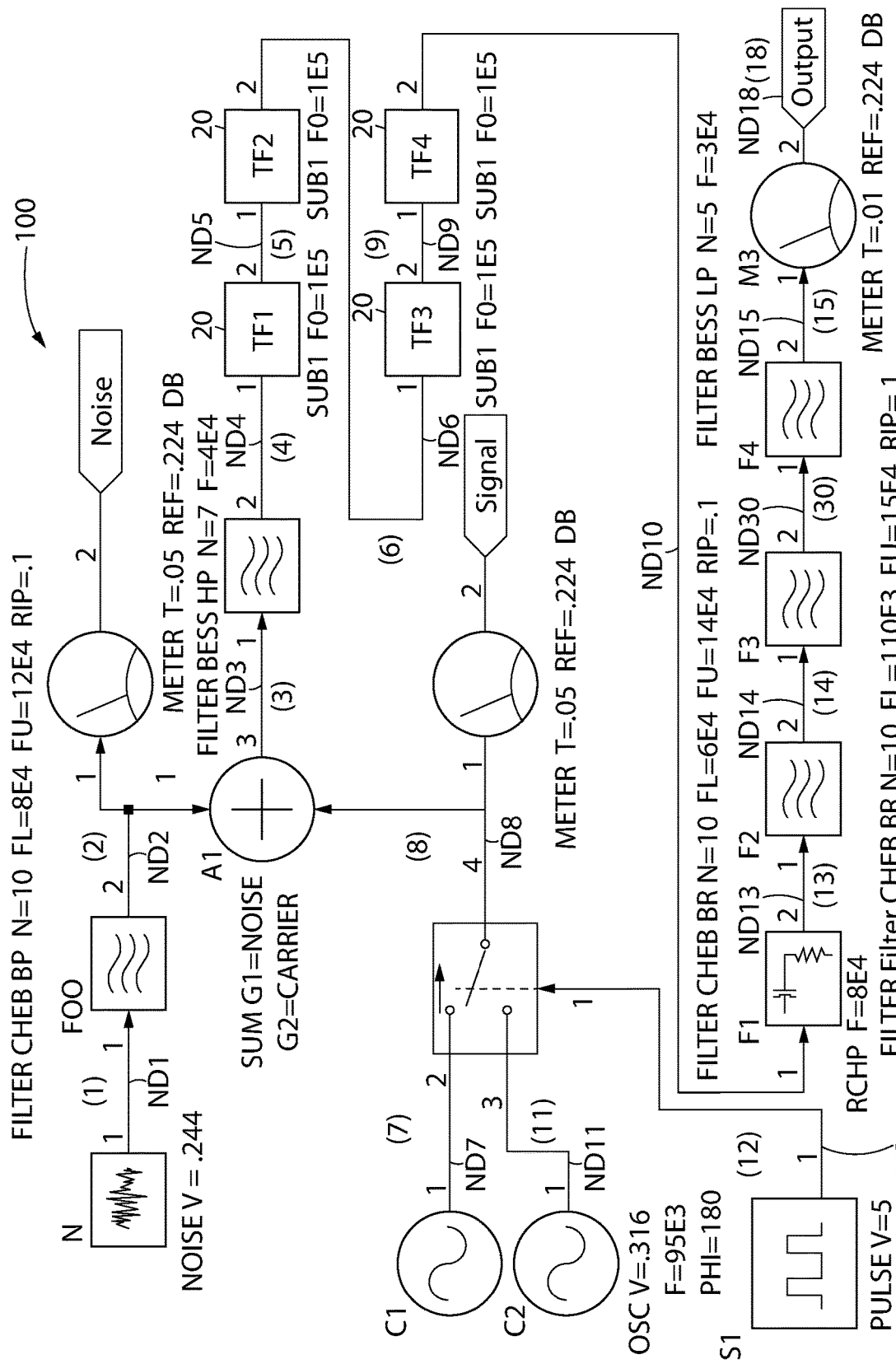
FIG. 12 is a block diagram of a test set up for evaluating a cascade of four (by way of example only) trans-filters and to which the following FIGS. 13-23 pertain.

FIG. 12 depicts a block diagram of a test setup 100 used to evaluate the response of a cascade of four (by way of example only) identical trans-filters 20. An FSK signal is generated using two oscillators and a switch. The mark and space frequencies are C1 at 105 KHz and C2 at 95 KHz. Switching rate is 50 Hz determined by Pulse Generator 51. Noise is provided by noise generator N. Total noise output power is 0 dBm in a 1 MHz band that is uniform in density at −60 dBm/Hz. Signal power at input to summer A1 is 0 dBm. FIGS. 13-23 depict the signals and signal responses of this test setup 100. It should be noted that with regard to the test setup 100, the following information is pertinent:

Carrier Power=C=0 dBM
for FSK modulation FCN=2;
Noise Power Density=−164 dBm/Hz;
For T=3,000 Deg Kelvin;
(C/KT)=−48 dB-Hz for Ps=−212 dBm;
Simulation step size=5E-7 sec; and Simulation time=0.11 sec.

Noise and signal are combined by the summing network A1. The values of G1 and G2 are used to establish the (C/KT) ratio for each measurement. The value of G1 establishes noise and ranges from 0 to 1E3 (which corresponds to $10^3$). G2 ranges from 0 to 1E-3 (which corresponds to $10^{-3}$). RMS power meters M1 and M2 are provided to measure signal and noise powers to establish the (C/KT) operating point for the measurements. A high pass filter F0 is used to attenuate any vestiges of the baseband signal to a negligible value.

Figure 13:
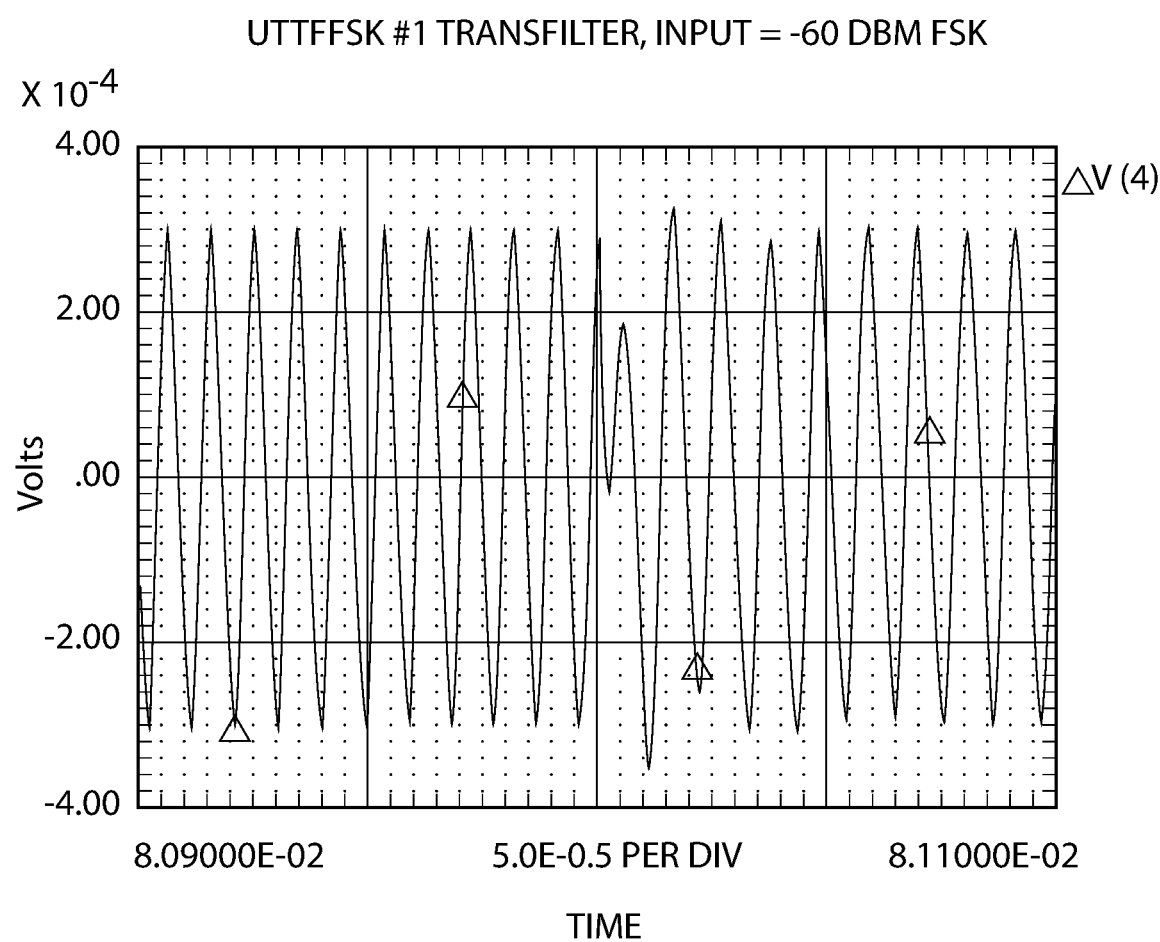
FIG. 13 depicts the frequency-shift keying (FSK) input signal that is high-pass-filtered and applied to a first trans-filter and wherein the signal is at a level of −60 dBm at node ND4.
Figure 14:
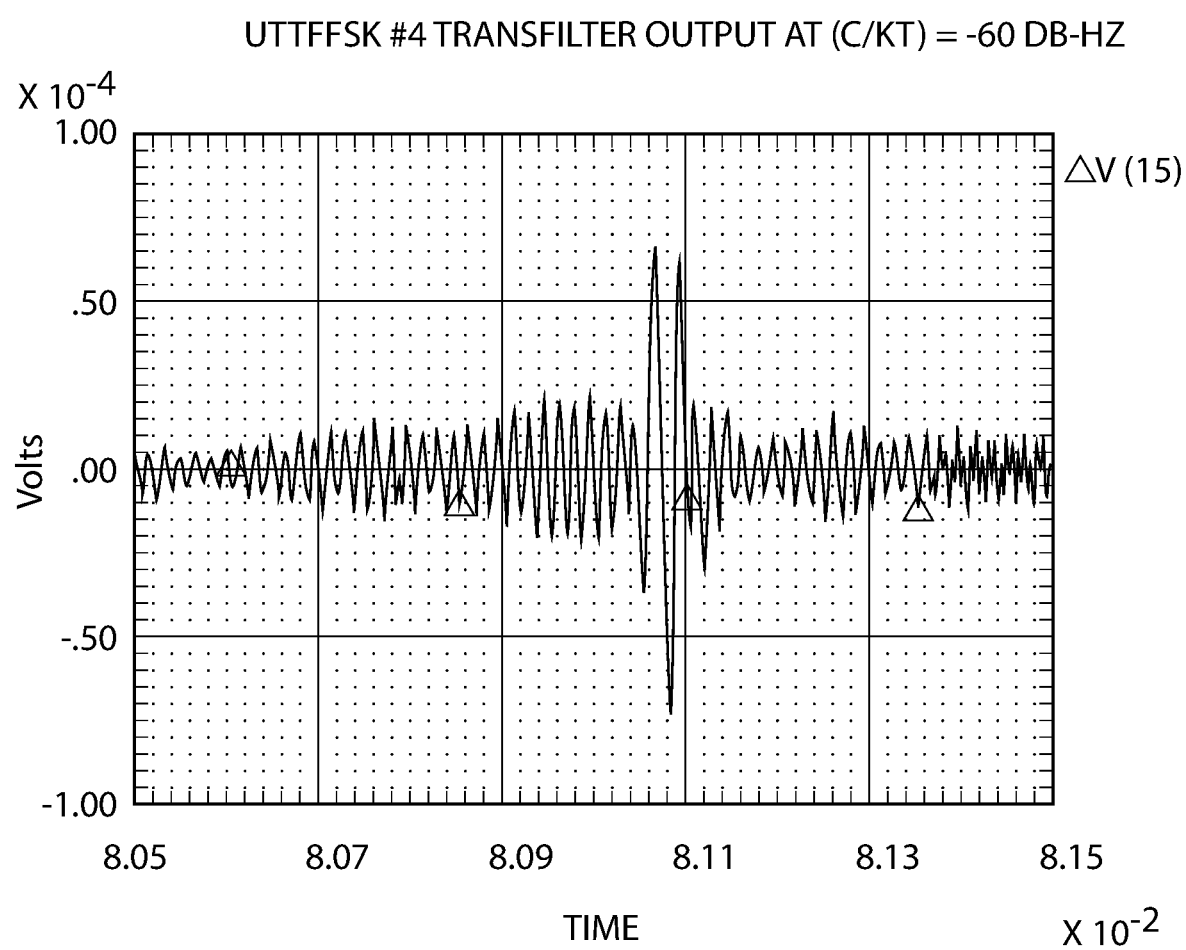
FIG. 14 depicts the trans-filter impulse output for the input signal of FIG. 13 in accordance with the mark/space transitions at node ND15 at an input (C/KT=−50 dB-Hz)
Figure 15:
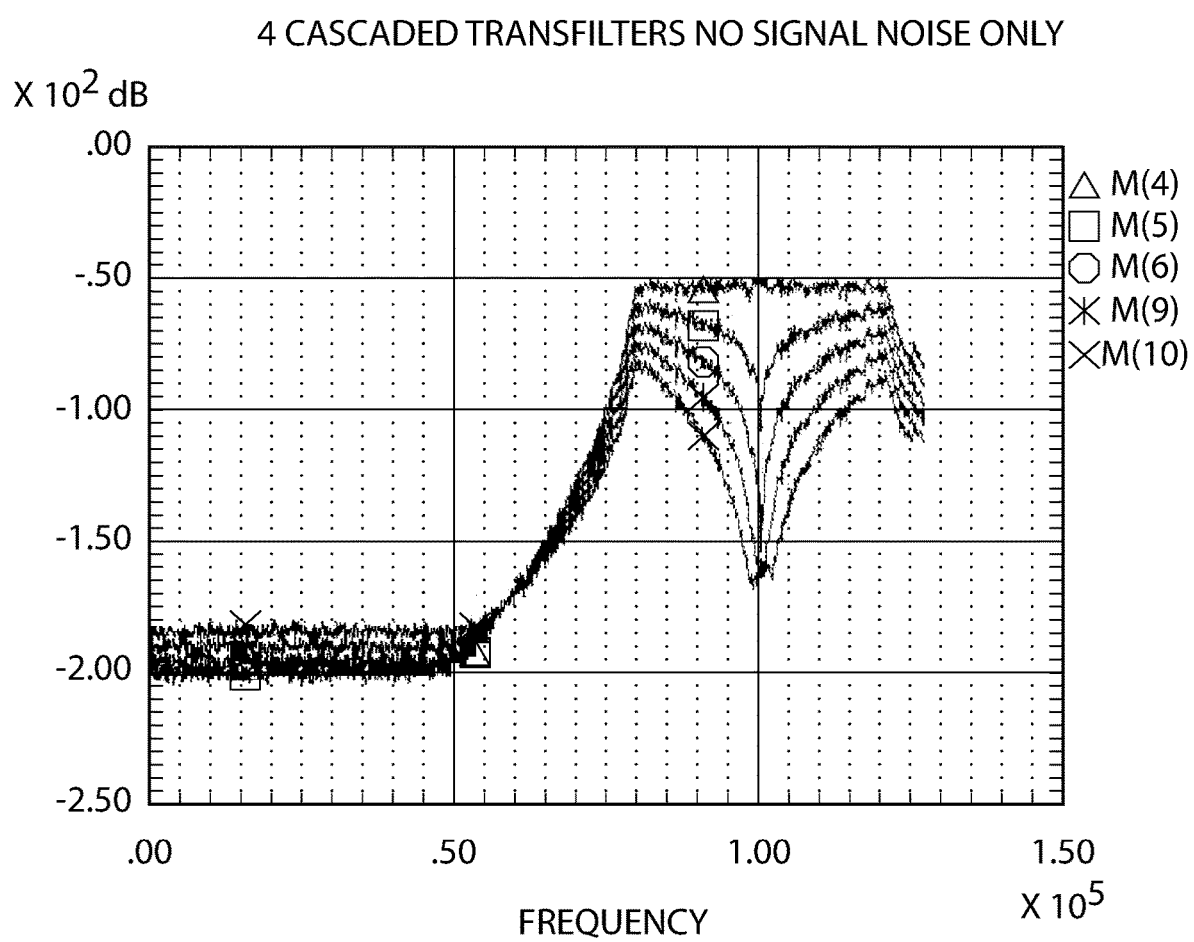
FIG. 15 is a spectrum diagram showing the input noise from the filter F0 and the output of each trans-filter.
Figure 16:
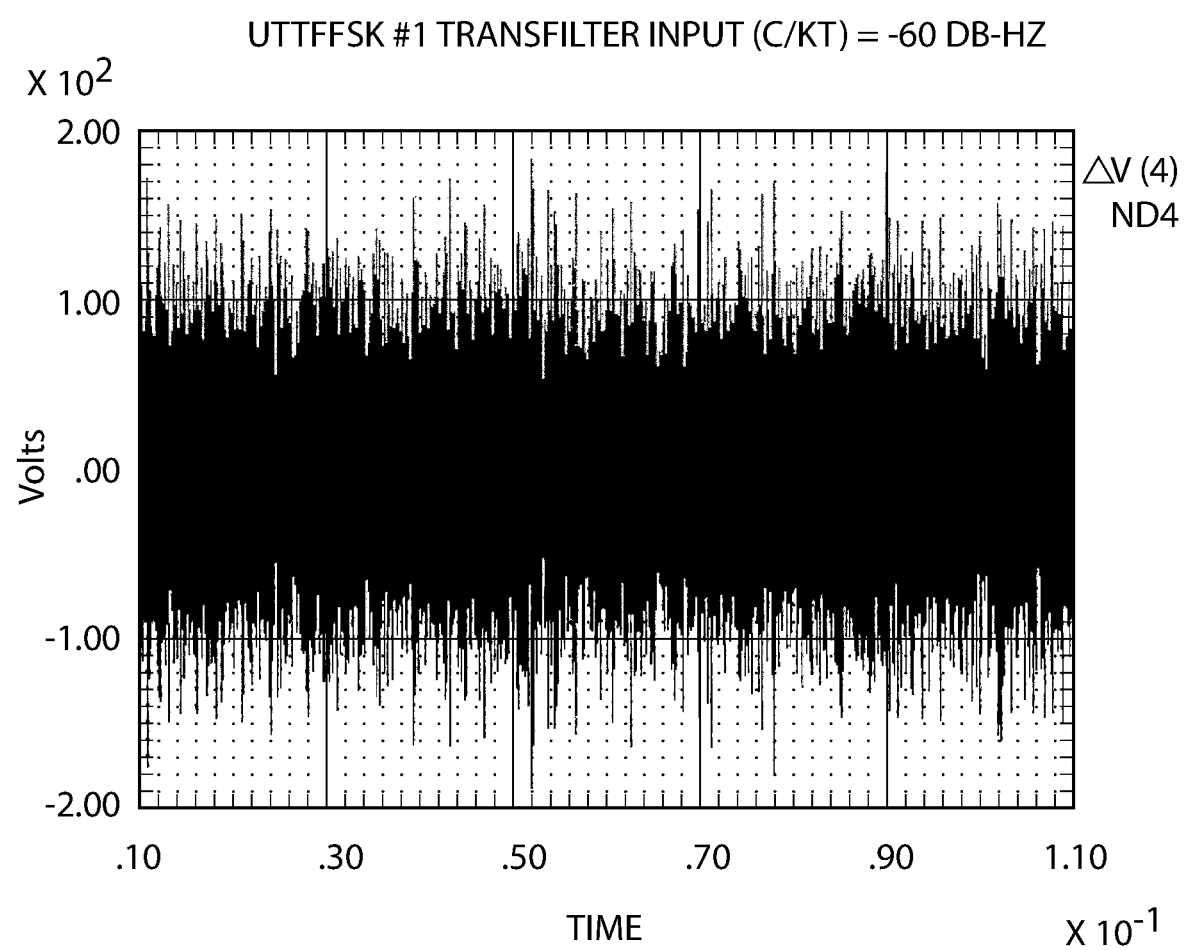
FIG. 16 is a voltage versus time measurement at the first trans-filter input and wherein the vertical scale is ±200 volts and the quantity C/KT=−60 dB-Hz at node ND4.
Figure 17:
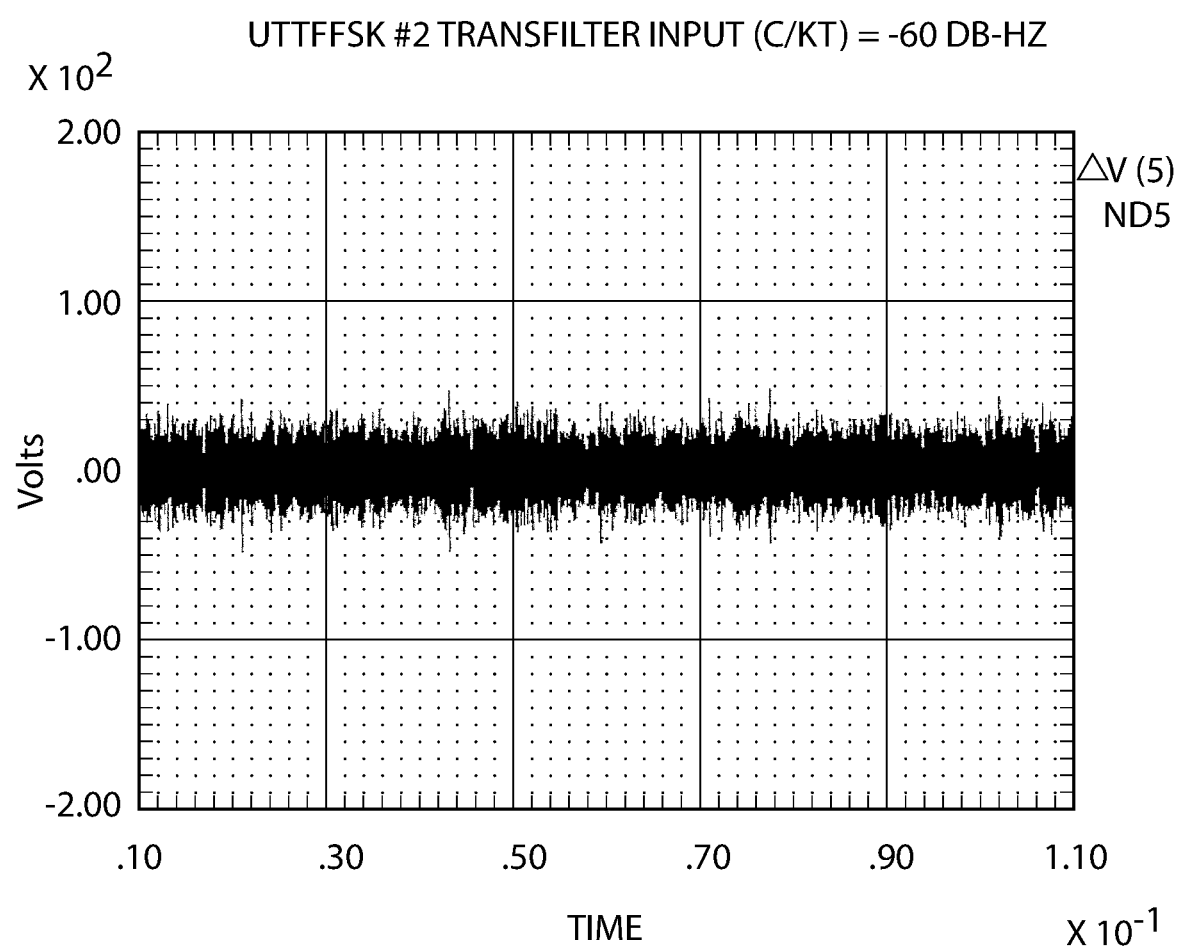
FIG. 17 is a voltage versus time measurement at the second trans-filter input and wherein the vertical scale is ±200 volts and the quantity C/KT=−60 dB-Hz at node ND5.
Figure 18:
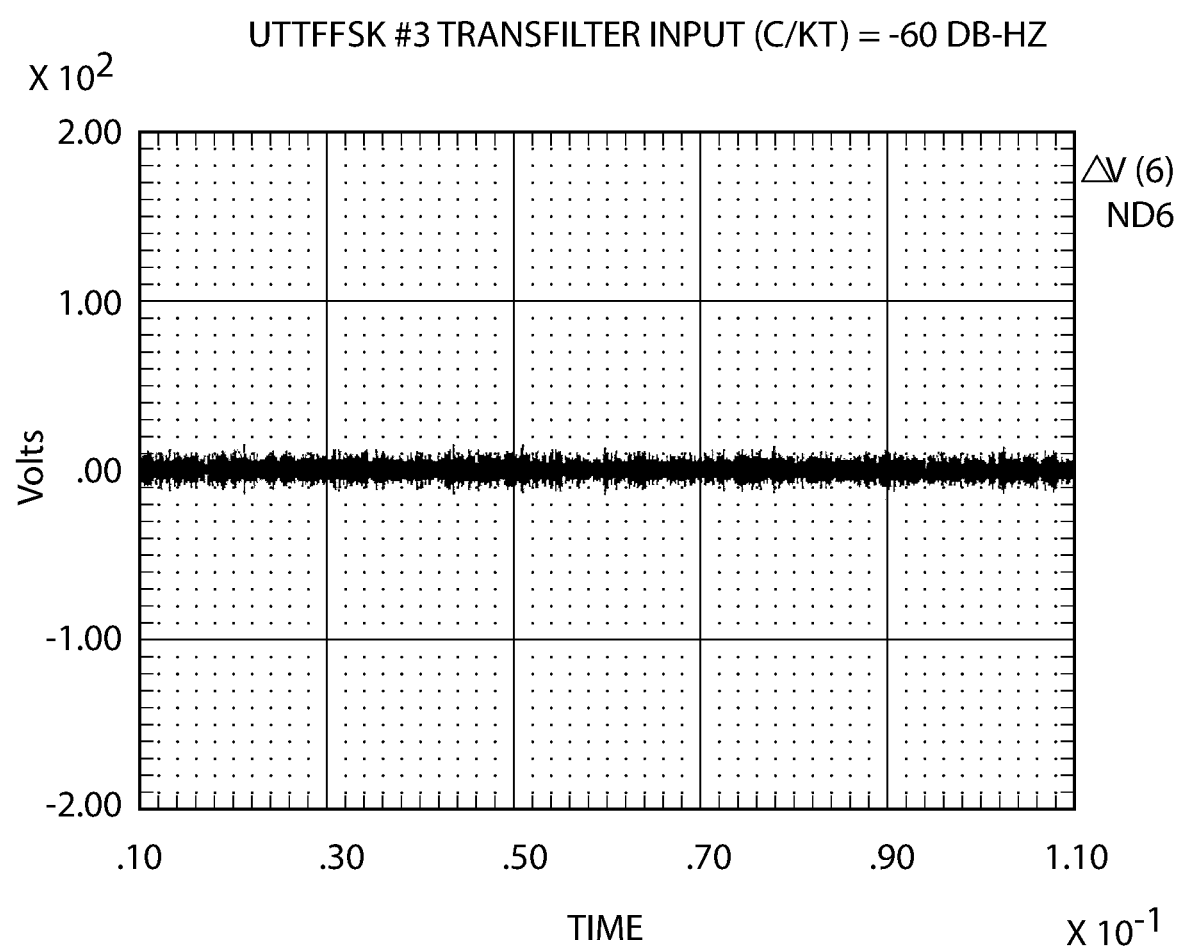
FIG. 18 is a voltage versus time measurement at the third trans-filter input and wherein the vertical scale is ±200 volts and the quantity C/KT=−60 dB-Hz at node ND6.
Figure 19:
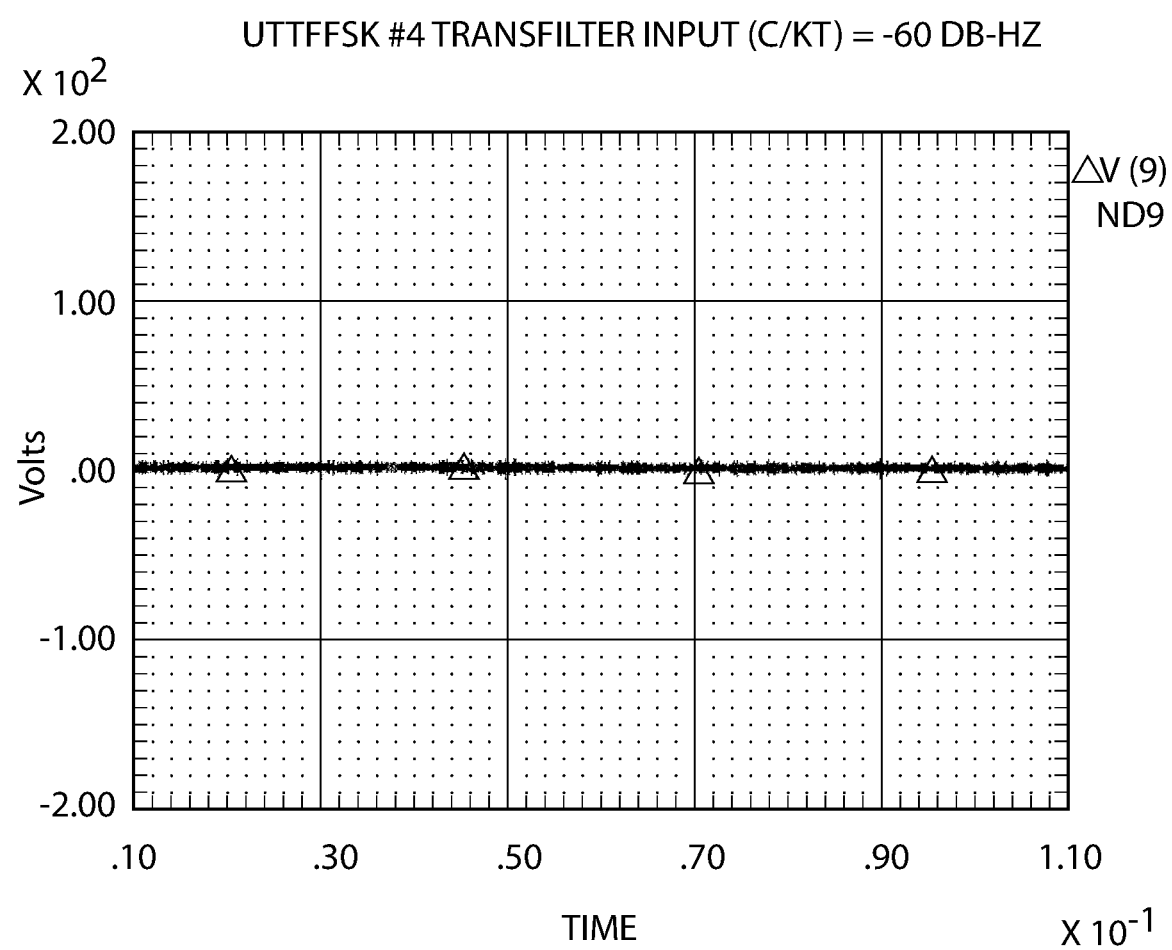
FIG. 19 is a voltage versus time measurement at the fourth trans-filter input and wherein the vertical scale is ±200 volts and the quantity C/KT=−60 dB-Hz at node ND9.
Figure 20:
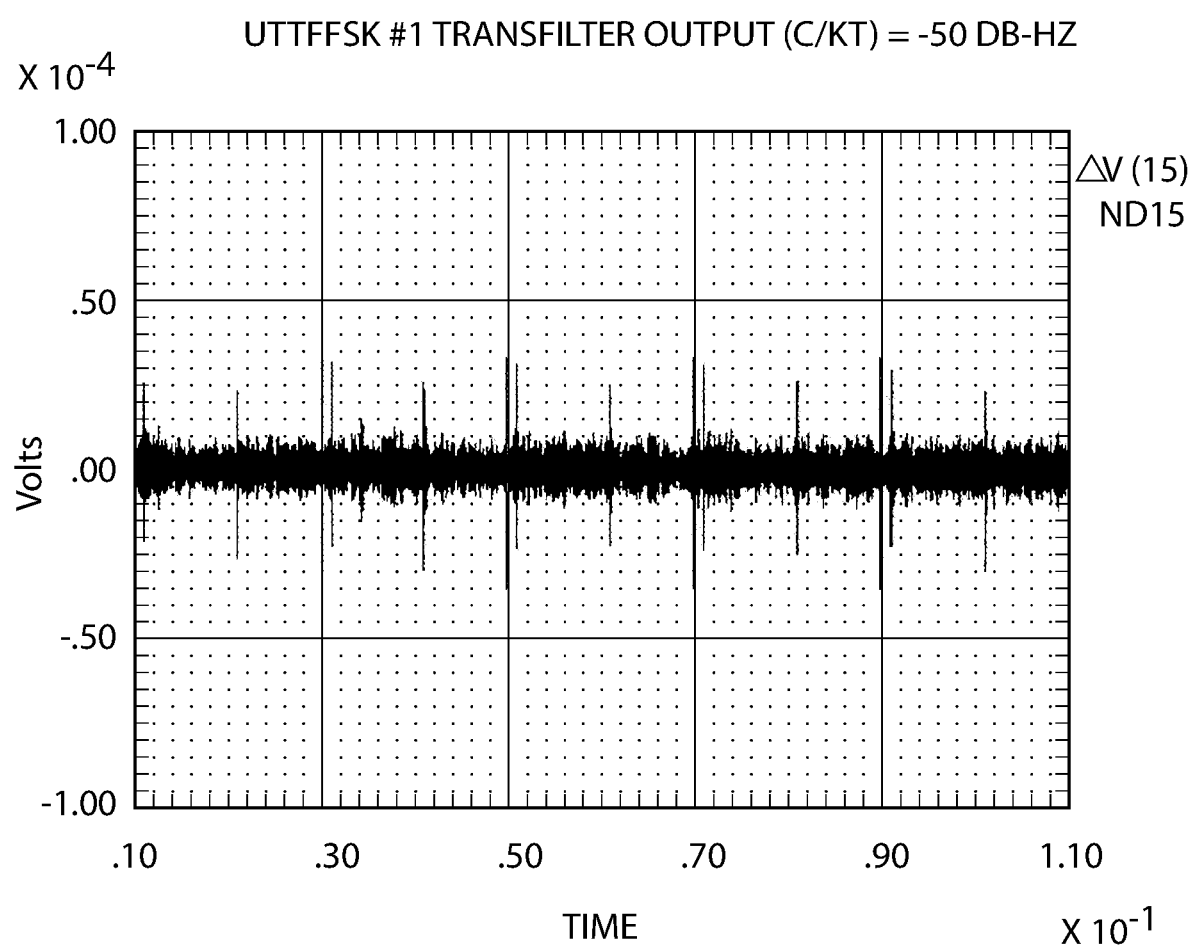
FIG. 20 is a voltage versus time measurement at the output of the first trans-filter, measured at node ND15, using a filter bank to reduce noise at baseband and wherein the impulses and noise at the quantity C/KT=−50 dB-Hz.
Figure 21:
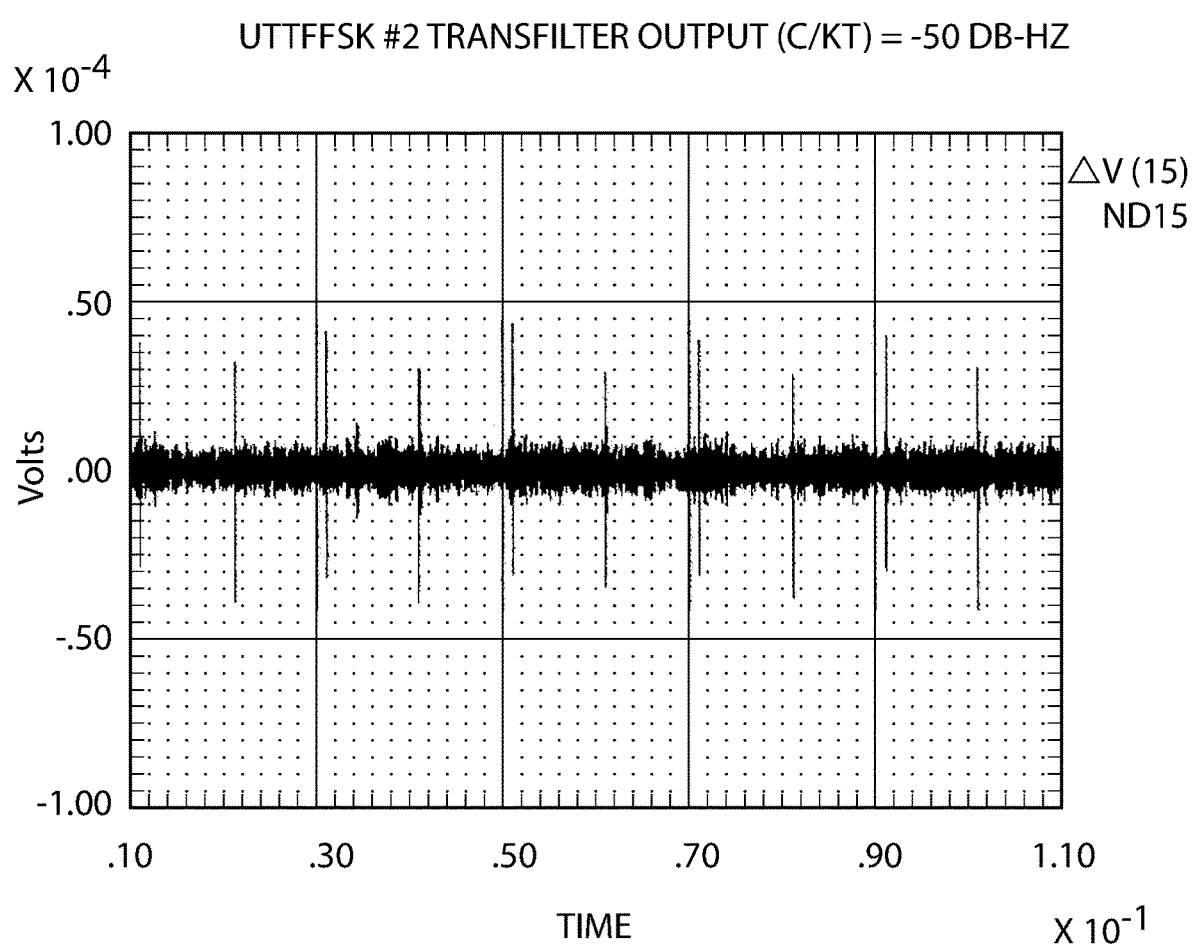
FIG. 21 is a voltage versus time measurement at the output of the second trans-filter, measured at node ND15, using a filter bank to reduce noise at baseband and wherein the impulses and noise at the quantity C/KT=−50 dB-Hz.
Figure 22:
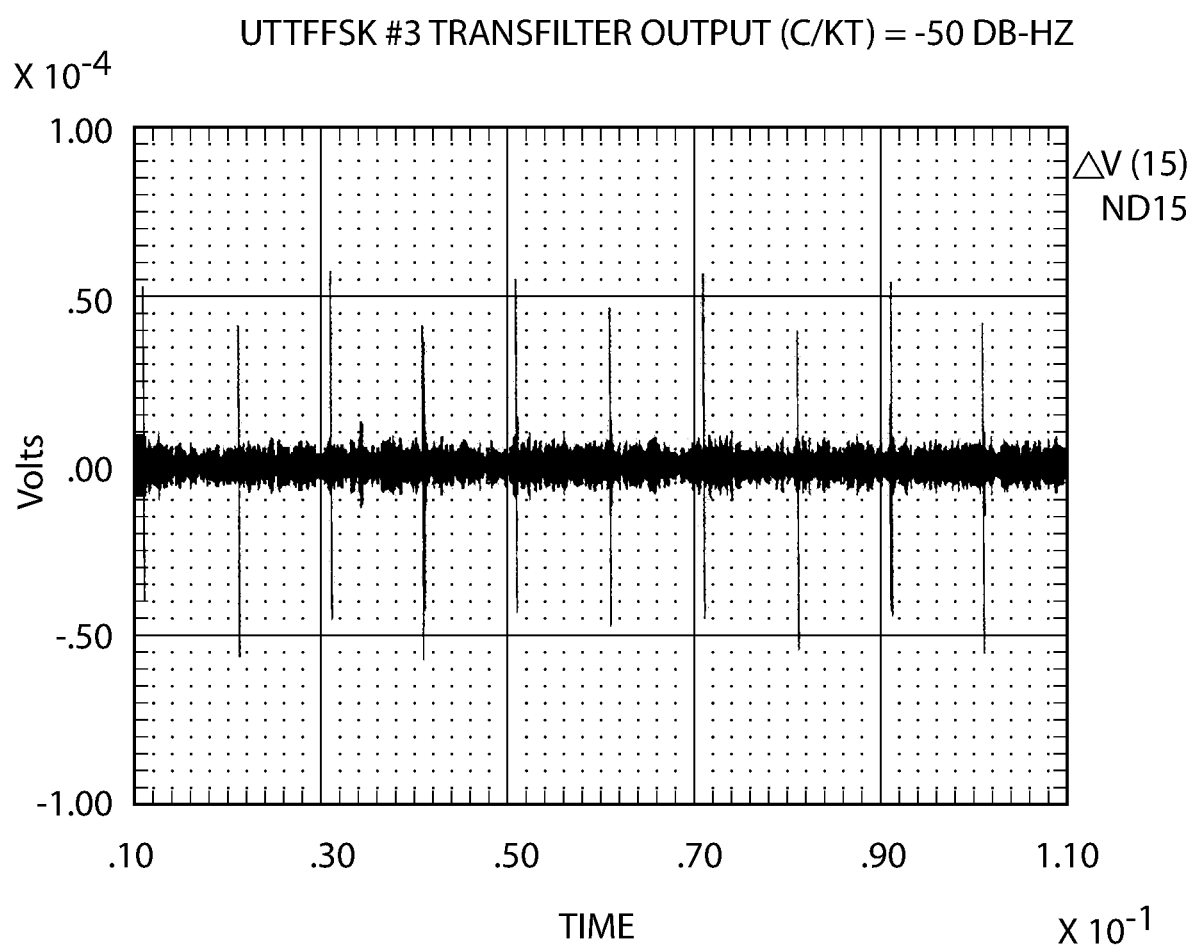
FIG. 22 is a voltage versus time measurement at the output of the third trans-filter, measured at node ND15, using a filter bank to reduce noise at baseband and wherein the impulses and noise at the quantity C/KT=−50 dB-Hz.
Figure 23:
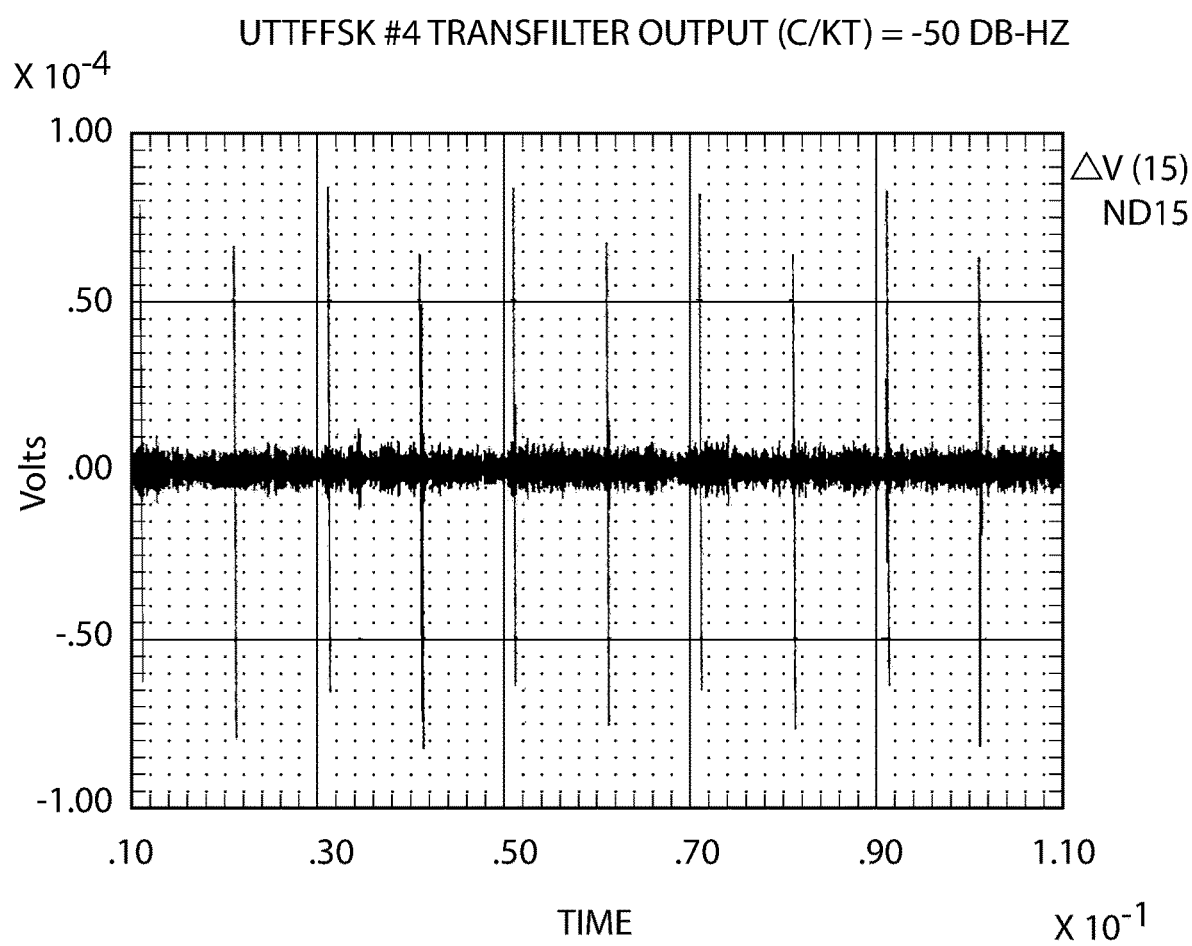
FIG. 23 is a voltage versus time measurement at the output of the fourth trans-filter, measured at node ND15, using a filter bank to reduce noise at baseband and wherein the impulses and noise at the quantity C/KT=−50 dB-Hz.

FIG. 13 shows the FSK signal of the filter F0 output which is fed to the first trans-filter 20; the signal at this point is at a level of −60 dBm. FIG. 14 shows the output pulse resulting from the mark/space transition with respect to FIG. 13. FIG. 15 is a spectrum diagram showing the input noise from the filter F0 and the output of each trans-filter 20 (TF1, TF2, TF3 and T4 shown in FIG. 12). The trans-filter TF1/TF2/TF3/TF4 outputs do not appear parabolic because the vertical scale in FIG. 15 is logarithmic; however, as discussed previously, each trans-filter 20 operates to transform flat noise by the linear slope relationship into a parabolic noise density distribution.

A series of high pass, low pass and band reject filters are provided at the output of the cascaded trans-filters 20 to attenuate noise that tends to obscure the impulses generated by the mark/space transitions. That same chain of filters is used to view the output of each trans-filter 20 (namely, TF1, TF2, TF3 and TF4) in the test circuit 100 at node ND15; thus, the views of FIGS. 20-23 depict the output of trans-filters TF1, TF2, TF3 and TF4, respectively. The band reject filters contribute negligible attenuation and degradation to the impulses that emanate from the summer A1.

FIGS. 16-19 clearly depict the successive compression of the noise at the output of TF1 (node ND4), TF2 (node ND5), TF3 (node ND6) and TF4 (node ND9). FIGS. 19-22 clearly depict the successive accentuation of the impulse outputs of each trans-filter TF1-TF4 as they are viewed at node ND15.

Figure 24:
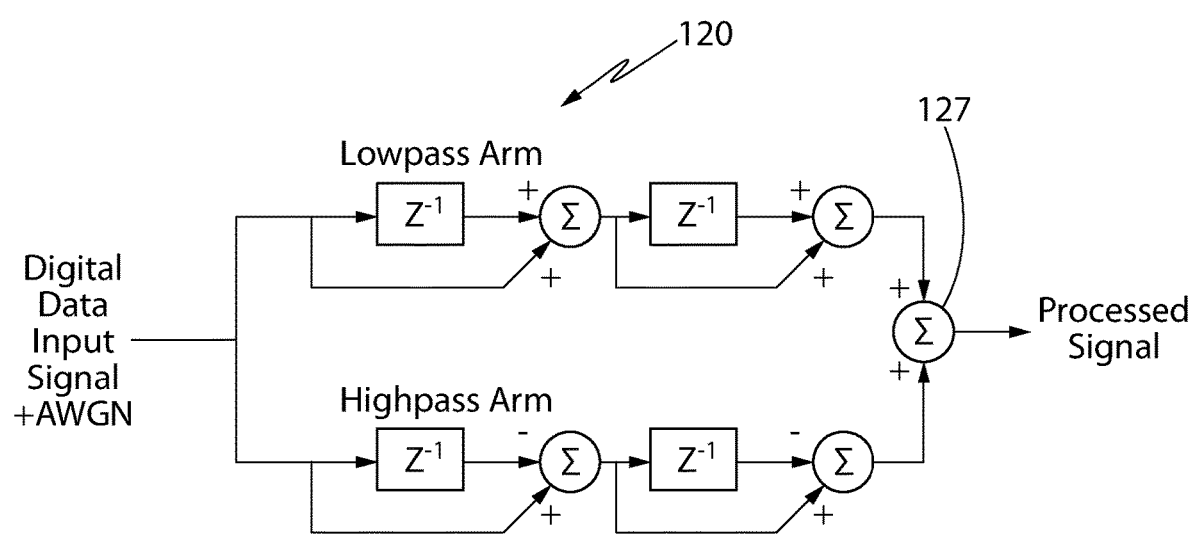
FIG. 24 is a block diagram of a digital trans-filter configuration of the present invention.

FIGS. 24-30 are directed to a digital version of the trans-filter, hereinafter referred to as the digital trans-filter (DTF) 120 and which is also LTI. In particular, FIG. 24 is a block diagram of the DTF 120. The DTF 120 is a lattice filter in which one arm performs a monotonic low pass filter function, while a second arm performs a monotonic high pass filter function. These filters are designed so that cascading two filters in each arm results in a 180 degree phase shift between the two arms; as such, the amplitude responses of the two arms are exactly equal at the center of the band, i.e., at the sampling frequency ($F_S$) divided by four, $F_S/4$ or also referred to as half of the Nyquist Frequency.

Figure 25A:
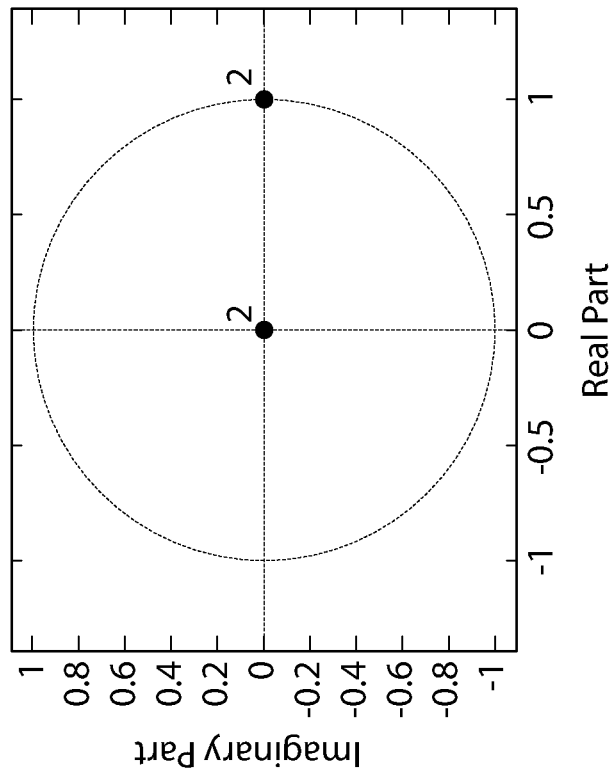
FIG. 25A is a low pass filter pole-zero z-plane representation of the low pass arm of FIG. 24.
Figure 25B:
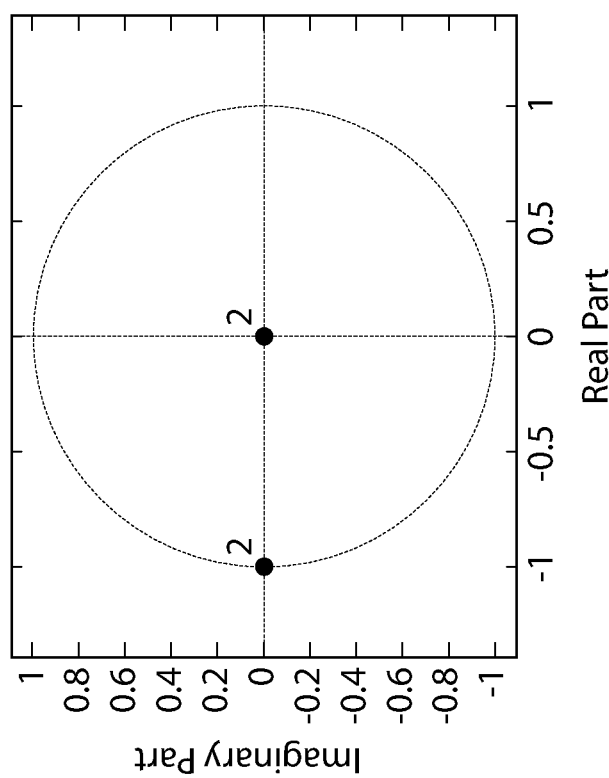
FIG. 25B is a high pass filter pole-zero z-plane representation of the high pass arm of FIG. 24.

FIGS. 25A/25B provide the low pass filter pole-zero z-plane representation of the low pass arm and the high pass filter pole-zero z-plan representation of the high pass arm, respectively.

Figure 26:
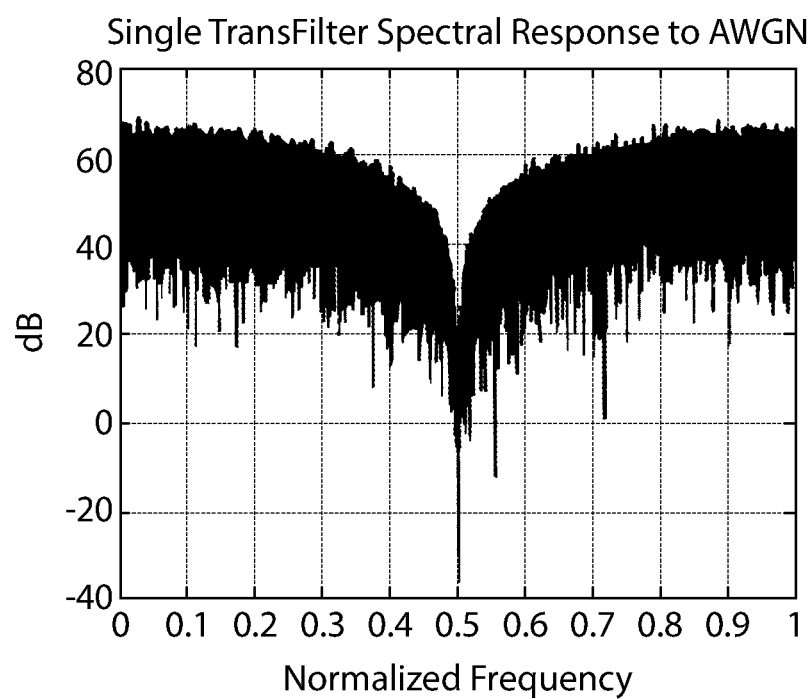
FIG. 26 is the spectral response of the digital trans-filter.
Figure 27:
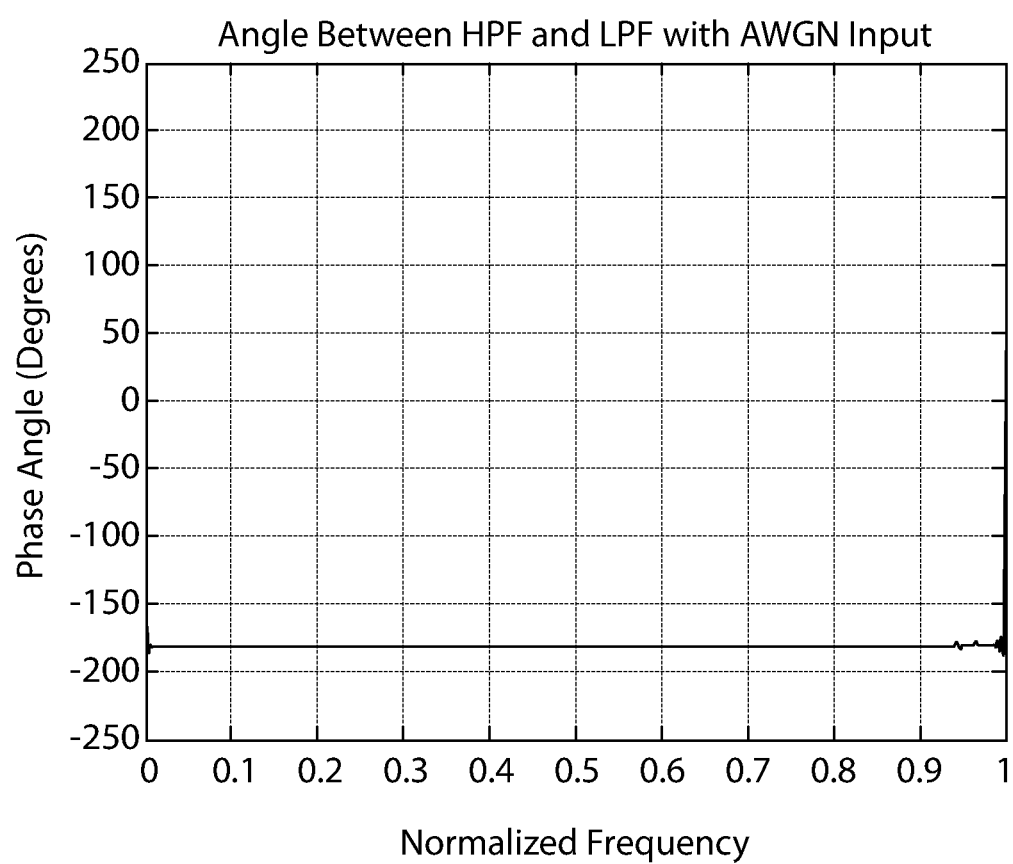
FIG. 27 is the phase response of the digital trans-filter.
Figure 28A:
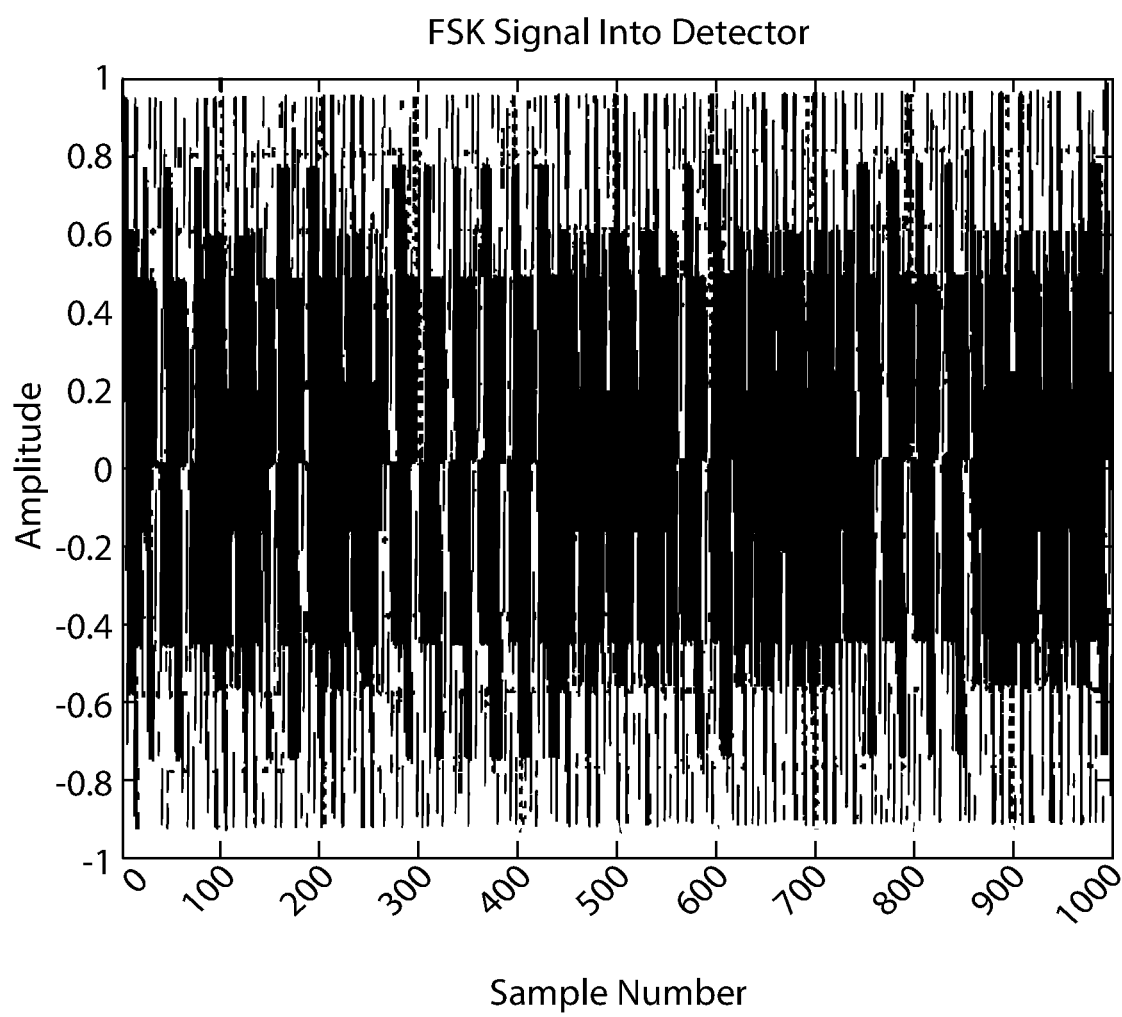
FIGS. 28A-28B are the input signal and the input noise, respectively, to the digital trans-filter.
Figure 28B:
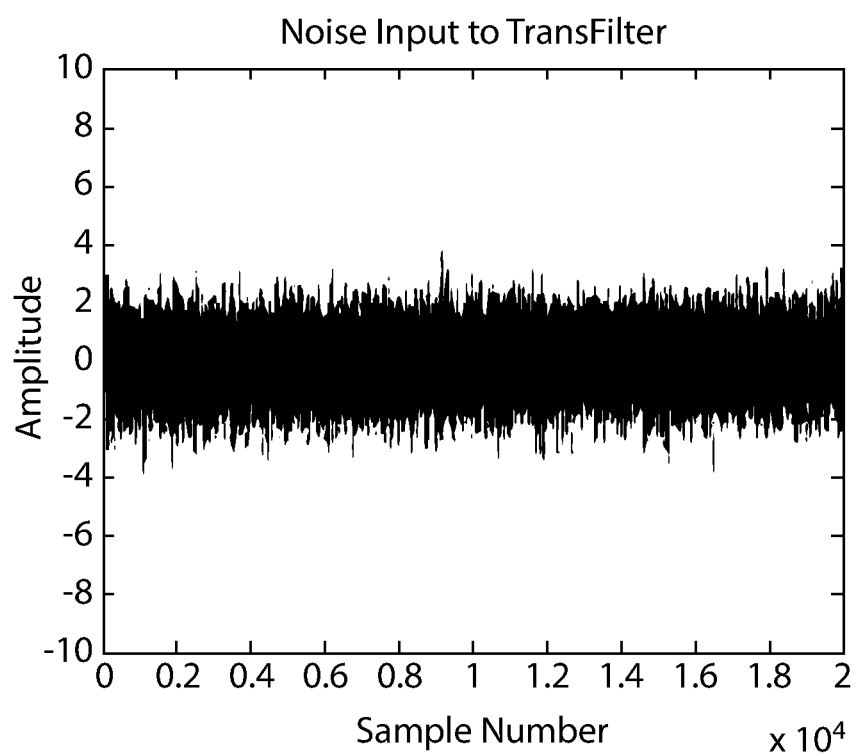
Figure 29A:
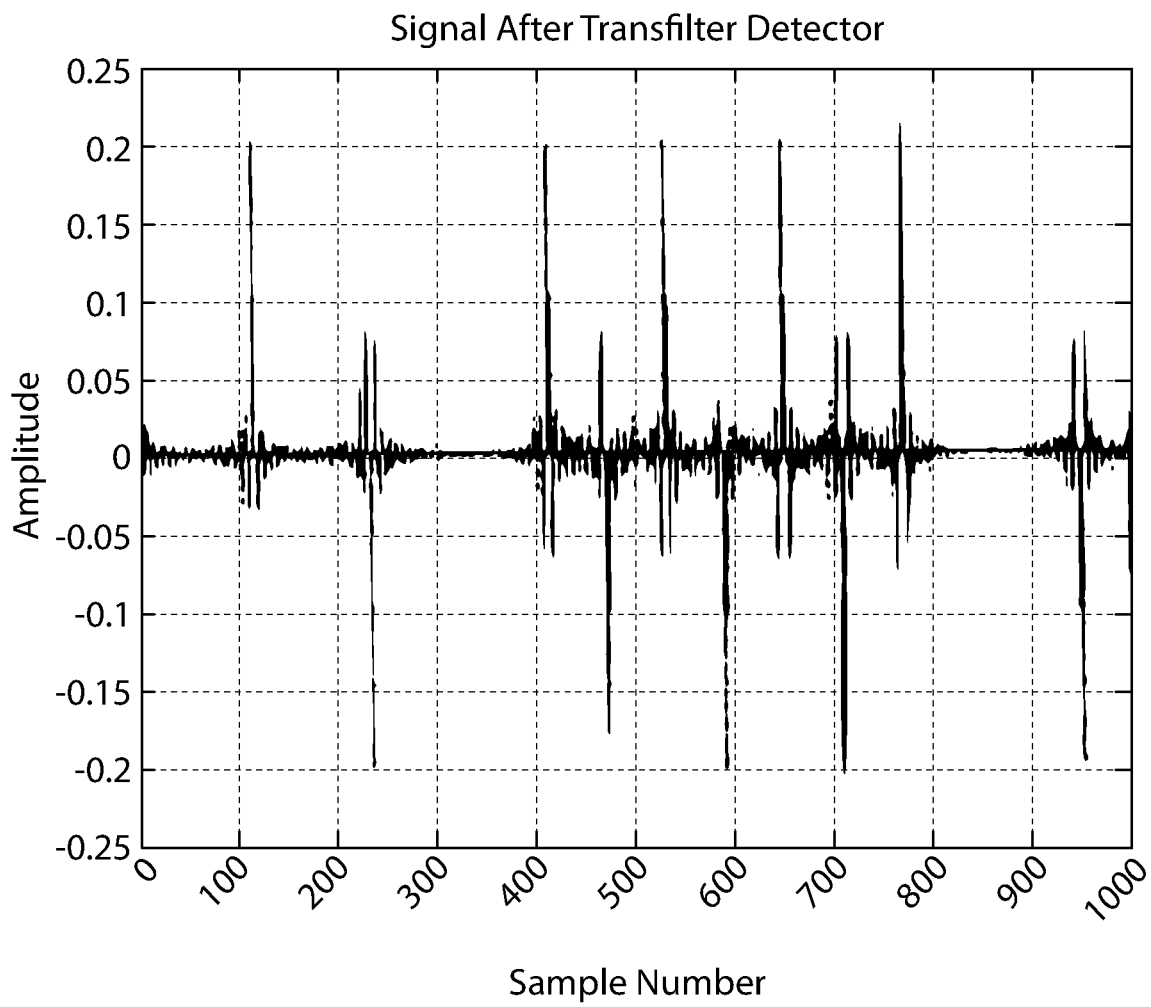
FIGS. 29A-29B are output signal and the output noise, respectively of the digital trans-filter.
Figure 29B:
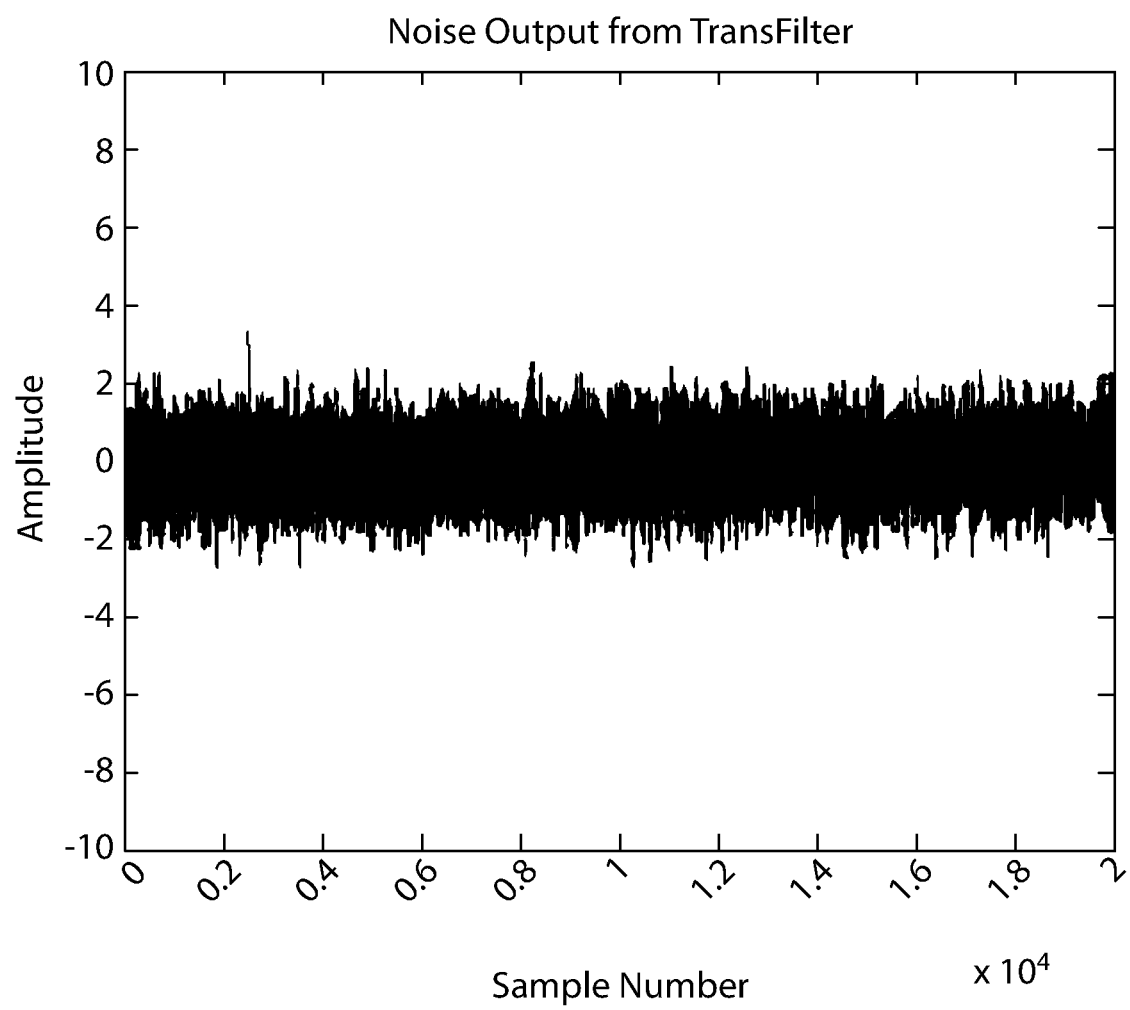

When the output of the two arms are added together at the summing network 127 of the DTF 120, the noise completely cancels at the center of the band and is reduced throughout the band; however, the signal deviation remains the same, resulting in increased SNR. The DTF's 120 spectral response is shown in FIG. 26. FIG. 27 is the phase response of the DTF 120. FIGS. 28A-28B depict the signal input and the noise input, respectively, to the DTF 120. FIGS. 29A-29B depict the signal output and the noise output, respectively at the DTF 120. In particular, FIGS. 28A-29A depict separate processing of noise and an FSK signal with a random bitstream message and carrier frequencies 0.2 and 0.3 times $F_S$. For best performance, these are arranged symmetrically around the trans-filter 120 null. Since the trans-filter 120 is completely linear (as well as LTI), it is valid to look at the noise and signal components separately. It can be seen that the noise level is reduced. The signal is seen to be demodulated, where each transition in the carrier frequency results in an impulse, positive for a transition from lower to higher frequency, and negative for a transition from higher to lower frequency. As previously described, the trans-filter 120 converts wideband exponential signals, in this case (by way of example only), FSK, into a set of positive and negative impulses. An output filter is used after the trans-filters 120 to remove non-impulsive energy. Since impulses have a white spectrum, this involves removing all narrowband energy prior to identifying the positive and negative impulses. This filtering step increases output SNR and removes the FM carrier frequency or frequencies.

As with the trans-filter 20, the DTF 120 can be cascaded with other DTFs 120 to increase noise compression and enhance impulse amplitudes for detection of the exponentially modulated signal.

Figure 30:
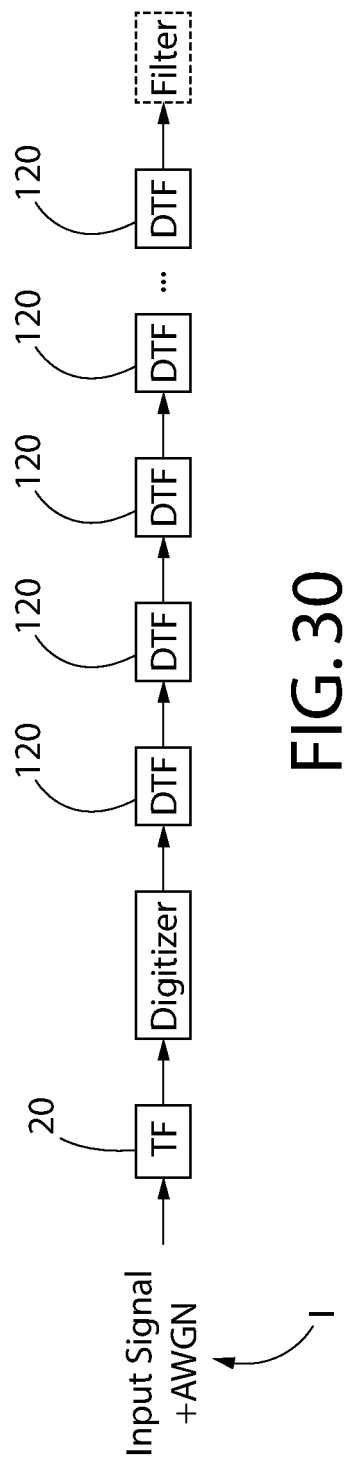
FIG. 30 is a block diagram showing a plurality of digital trans-filters being cascaded, including the use of the first embodiment of the trans-filter being used as a noise compressor before the input signal is converted to a digital signal.

It should be further understood that the trans-filter 20 may also act as a pre-stage for an analog-to-digital (A/D) converter in a reconfigurable receiver to compress the noise in the analog input signal prior to the A/D conversion process. For example, as also shown in FIG. 30, the trans-filter 20 can compress in-band noise before the analog signal is digitized (e.g., an A/D converter). The digitized signal is then inputted into a cascade of DTFs 120. In particular, the trans-filter 20 may be used in cases where the SNR would be adversely affected by the digitizer's quantizing noise. After digitization, one or more DTFs allow detection at improved SNR. It should be further noted that the first DTF 120 in the cascade detects the signal, whether analog or digital. As discussed previously also, in some circumstances the output signal of the final DTF 120 of the cascade can be further filtered (e.g., the low pass filter 16 as shown in FIG. 5).

In view of the foregoing, the key features of the trans-filter 20/120 for digitally-modulated signals are:
 (1) compresses noise in the signal band;
 (2) generates impulses at data transitions for any modulation format;
 (3) can be cascaded with other trans-filters 20/120 to increase noise compression and impulse amplitude;
 (4) demodulates carrier regenerating transitions of data stream;
 (5) experiences a latency equal to one bit period; and
 (6) requires no precision oscillators or timing.

Time Domain Trans-Filter 220

Figure 31:
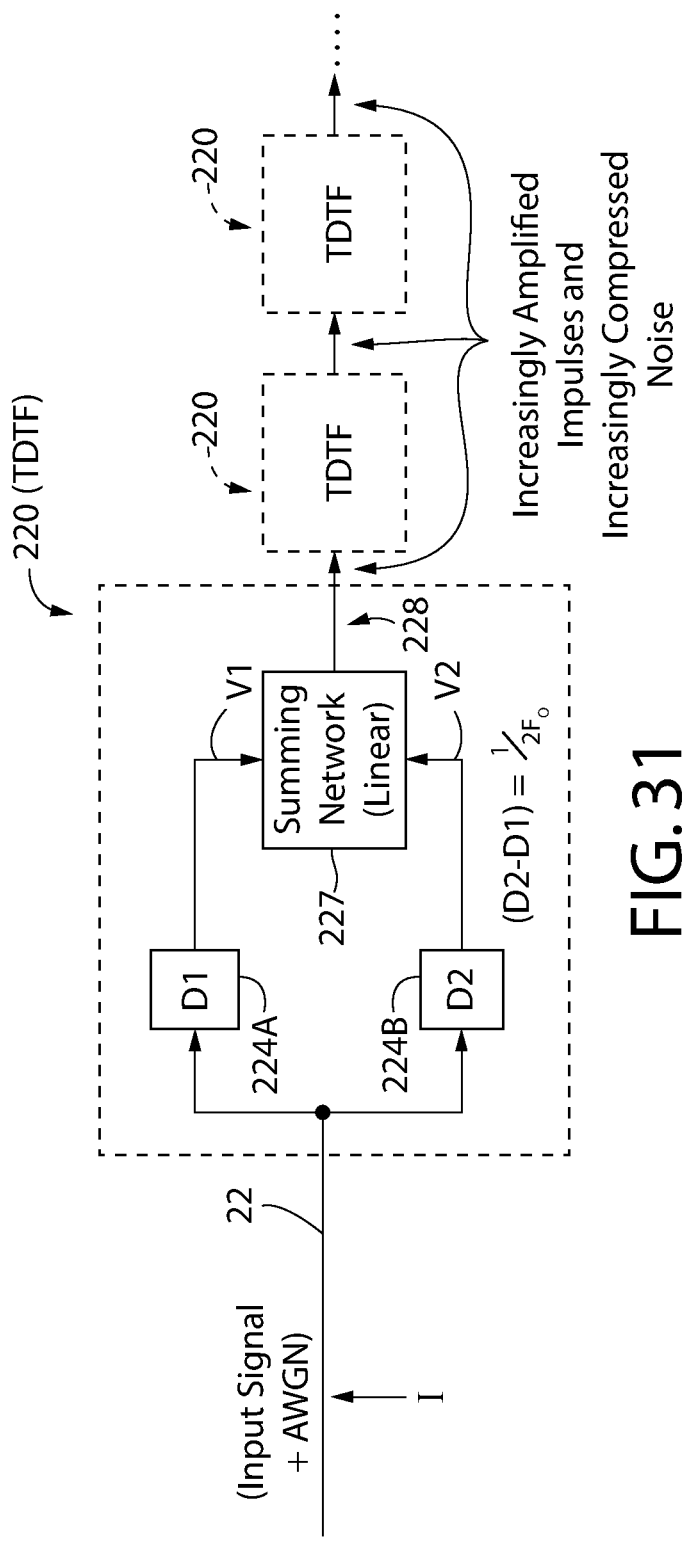
FIG. 31 is a block diagram of a time-domain trans-filter (TDTF)

The discussion set forth above for the trans-filter 20 and the digital trans-filter 120 can be generally termed a "frequency-domain" trans-filter 20/120 or FDTF. Another variation of the trans-filter 20 is a time domain trans-filter (TDTF) 220 as shown in FIG. 31. The TDTF 220 generates the same output as described for the trans-filter 20 or digital trans-filter 120 but the TDTF 220 is simpler, more linear (e.g., produces less distortion), is implemented more easily (e.g., it has fewer components) and can be applied over a wider range of operating frequencies. As with the trans-filter 20 and digital trans-filter 120, the TDTF 220 also exhibits the ability to reduce in-band noise, generate polarized impulses and can also be cascaded, increasing both noise reduction and impulse enhancement as described previously. The TDTF 220 is also LTI.

Figure 31A:
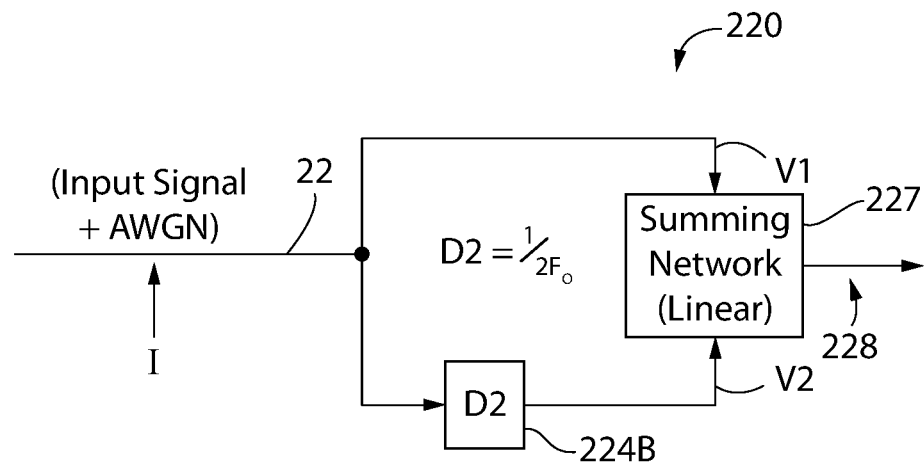
FIG. 31A is a block diagram of the TDTF where the entire delay is in only one of the paths.

As shown in FIG. 31, the TDTF 220 replaces the parallel frequency selective networks 24A and 24B with a delay D1 224A and D2 224B in each of the two parallel paths, thereby generating delay signals V1 and V2, respectively. The criteria for the TDTF 220 is that the difference in delays, i.e., D1−D2 must equal to $1/(2F_0)$. In an ideal situation, it may be possible to have the requisite delay (i.e., $1/(2F_0)$) occur in either D1 or D2 (FIG. 31A) to achieve the relative delay between the two signals V1 and V2.

Figures 32A, 32B, 32C:
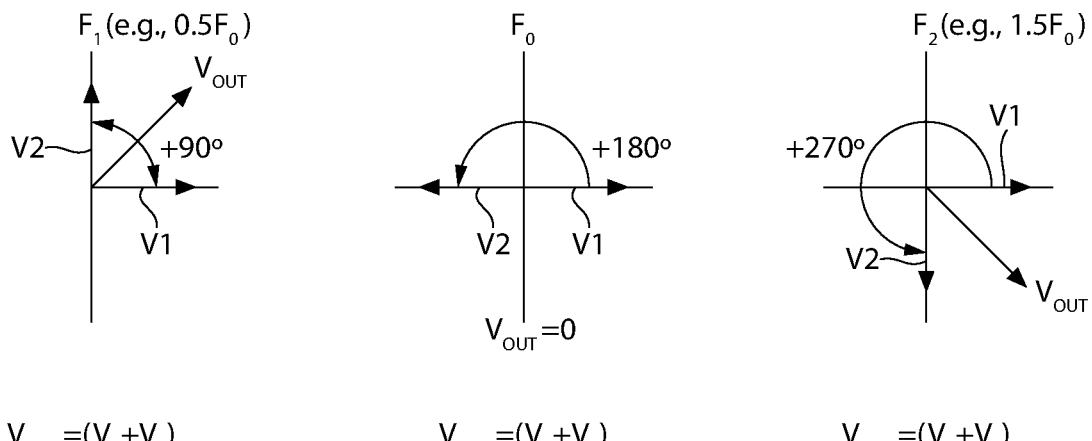
FIGS. 32A-32C are vector diagrams showing the amplitude and phase of v1 and v2 vectors at the frequencies $F_1$, $F_0$ and $F_2$ of the TDTF, respectively.

In addition, unlike in the FDTF 20/120 where the output amplitude of each frequency selective network signals V1 and V2 (FIG. 7) varies with frequency, in the TDTF 220 the output amplitude of delay signals V1 and V2 is constant. Furthermore, as shown in FIG. 7, the frequency selective network signals V1 and V2 are always 180° degrees out of phase, whether at the operating (also referred to as the "center") frequency, $F_0$, of the filter 20/120 or below ($F_1$) the center frequency or above ($F_2$) the center frequency; in contrast, in the TDTF 220, the delay signals V1 and V2 are only 180° degrees out of phase at the center frequency, $F_0$, of the filter 220; elsewhere the phase difference varies. See FIGS. 32A (below $F_0$), 32B (at $F_0$) and 32C (above $F_0$).

Although there are numerous ways to implement the delays D1 224A and D2 224B, a preferred manner is via propagation delay based on the particular conductor, or conductor trace, length used in conventional transmission line analysis. It should be understood that whichever manner the delays 224A and D2 224B are implemented, only linear components (or no components at all, other than conductor or conductor trace length) are used as with the FDTF 20/120. As such, this linear component (or no component) restriction eliminates the threshold phenomenon that limits detection sensitivity of exponentially-modulated signals.

The delay signals V1 and V2 (which include the noise in the signal band) are then summed in a summer network 227 and the output signal 228 is similar to all of the foregoing discussion regarding output signal 28.

The transfer function of the TDTF 220 exhibits the characteristics of a comb band reject filter (FIG. 33) when the difference in time delay between the summing circuit 227 input ports is an odd multiple number of half periods of the unknown input frequency of the incoming exponentially-modulated signal I. The frequency difference between teeth in the comb, $F_X$, is the reciprocal of the time delay between inputs to the summing circuit 227. $T_X=1/F_X=(D2-D1)$. The frequency of the Nth tooth in the comb is given by $F_N=(2N-1)(F_X/2)$, where N is any positive integer. Each of the teeth in the comb band reject filter extracts the frequency derivative of applied signals while reducing in-band noise at each tooth in the comb. Because the comb band reject filter characteristic of the TDTF 220 takes the derivative of any incoming signal I having a frequency at any tooth in the filter, this makes the TDTF 220 an ideal filter structure for rapidly determining the unknown input frequency of the incoming exponentially-modulated signal I. In particular, this filter structure can be used for rapid threat location.

It should be further understood that, like the FDTF 20, the TDTF 220 can be implemented in analog or digital versions.

Figure 33:
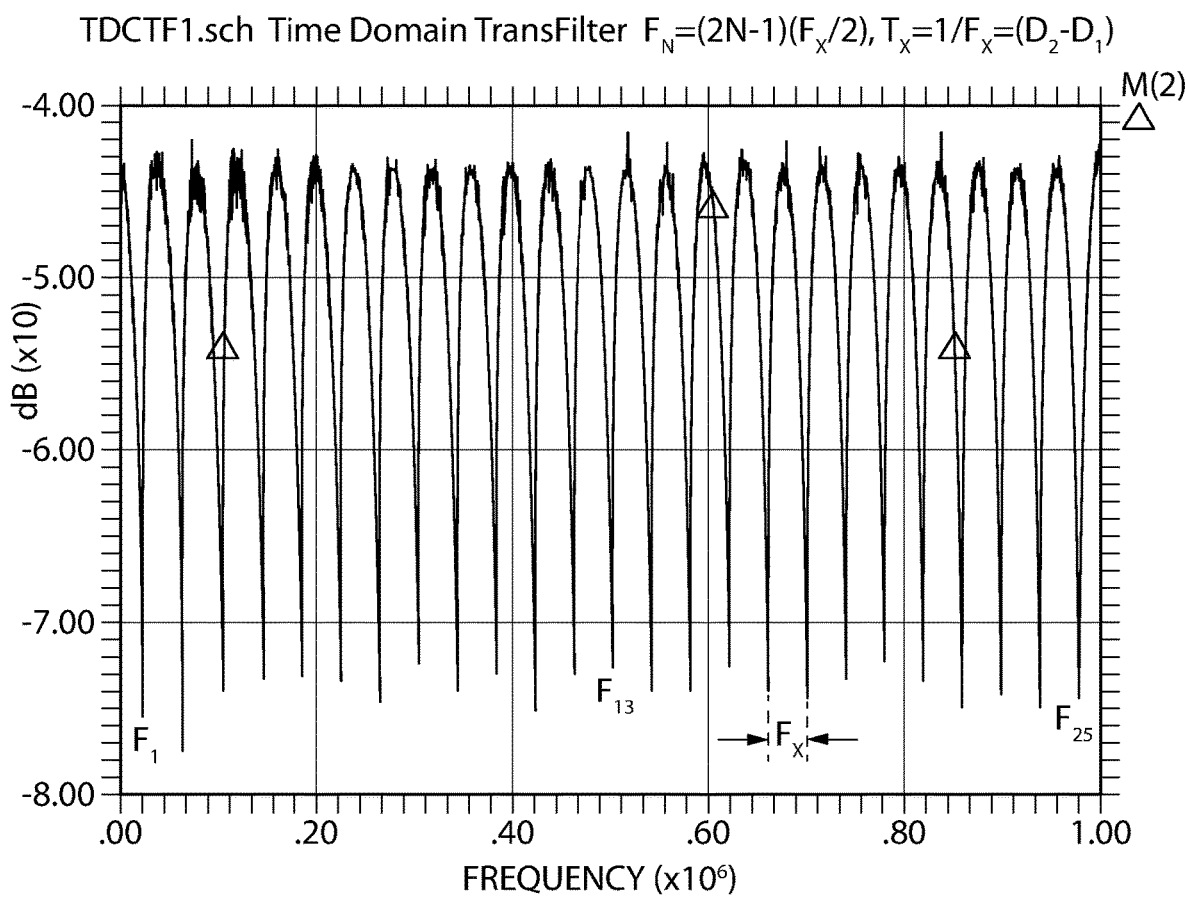
FIG. 33 depicts the output of the time-domain trans-filter having an output that is characteristic of a comb-band reject filter.

It should be further understood that the subscripts used for the frequency indications in FIG. 33 and the corresponding text in the Specification are not connected to the subscripts used in the previous discussions.

Thus, as with the frequency domain trans-filter 20/120, the TDTF 220 reduces in-band noise, converts exponentially-modulated signals to baseband, asynchronously generates polarized impulses at data transitions of digitally modulated signals. In addition, the TDTF 220 generates a band-reject comb filter response that extracts the frequency derivative and reduces in-band noise at each tooth in the comb.

In view of all of the foregoing, it should be understood that the frequency domain trans-filter 20/120, the TDTF 220 can be used wherever Matched Filter/Coherent Detectors are used and operate at negative input signal-to-noise ratios to recover RADAR, SONAR, communications or data signals.
Negative Noise Figure As mentioned previously, both the Time Domain 220 and Frequency Domain TransFilter 20/120 detectors are highly sensitive to phase or frequency variations on a carrier signal and are exceptionally insensitive to amplitude variations. As also mentioned previously, both the Time Domain 220 and Frequency Domain TransFilter 20/120 detectors reduce in-band stationary noise (AWGN) and detect exponentially modulated signals with little loss or significant gain in the case of cascaded units. Increase in output SNR relative to input SNR endows the TransFilter with a negative noise figure which in turn increases detection sensitivity. Negative noise figure is a game changer for receiver sensitivity, making it possible to achieve the ultimate receiver sensitivity, $Ps=hF_o$, the power of one photon at the carrier frequency $F_o$ (where Ps is system sensitivity and h is Planck's Constant). As also discussed above, both types (viz., frequency domain TF and time domain TF) achieve this by first splitting (signal+noise) into two bands.

For the Frequency Domain TF 20/120, the FDTF 20/120 then holds the phase difference between the two paths constant at 180 degrees while varying the complementary amplitudes of the two signals. One path has a +dV/dF slope while the other has a −dV/dF slope. The sum of the complementary amplitudes is the FDTF 20/120 output which goes from + to − passing thru zero at $F_o$, the band center.

For the Time Domain TF 220, the TDTF 220 has a time delay difference in the two paths that varies linearly with frequency. The time delay is equivalent to 180 degrees at $F_o$. The summed output of the two paths has a monotonic slope that passes thru zero at $F_o$, changing signs at this point.

Moreover, the TDTF 220 has multiple (combtooth) responses at odd harmonics of $F_o$ while the FDTFs 20/120 have only one response at $F_o$.

The TFs (both FD and TD) are band reject structures and, as such, the bandwidth increases when they are cascaded.

Exponential signals are coherently converted to baseband by the derivative process (The dV/dF slope of the TransFilter/Detector without the use of mixer or local oscillator greatly simplifying the cost, size, and complexity of the receiver.

Both the FDTF 20/120 and TDTF 220 are LTI circuits and may be cascaded, increasing both noise reduction and signal gain by extracting successive derivatives of the signal.

Both the FDTF 20/120 and TDTF 220 have negative noise figures as a direct result of ncreasing output SNR relative to input SNR. Cascading increases the magnitude of the negative noise figure and can approach the ultimate limit.

The ultimate receiver sensitivity ($Ps=10 \log (hF_o)$) may be achieved by cascading FDTF 20/120 or TDTF 120.

As a result of the foregoing, the TransferFilter of the present invention exhibit the following critical characteristics, 1. Negative Noise Figure of cascaded units that result in ultimate receiver sensitivity;
2. Increase of bandwidth when units are cascaded;
3. Reduction of high in-band noise at low frequencies, allowing operation at low receiver frequencies where Path Loss is lower; and
4. The increase in pre-detection SNR by summing coherently converted baseband outputs of multiple small terminals make it possible to detect and track PHO (potentiallyhazardous objects) as distant as the Asteroid Belt using multiple small terminal arrays.

The present application discloses a revolutionary filter system (also referred to as a "trans-filter"), both in the frequency domain (FIGS. 2-30) and in the time domain (FIGS. 31-33), that minimizes in-band noise while maximizing detection sensitivity of exponentially-modulated signals.

Figure 11:
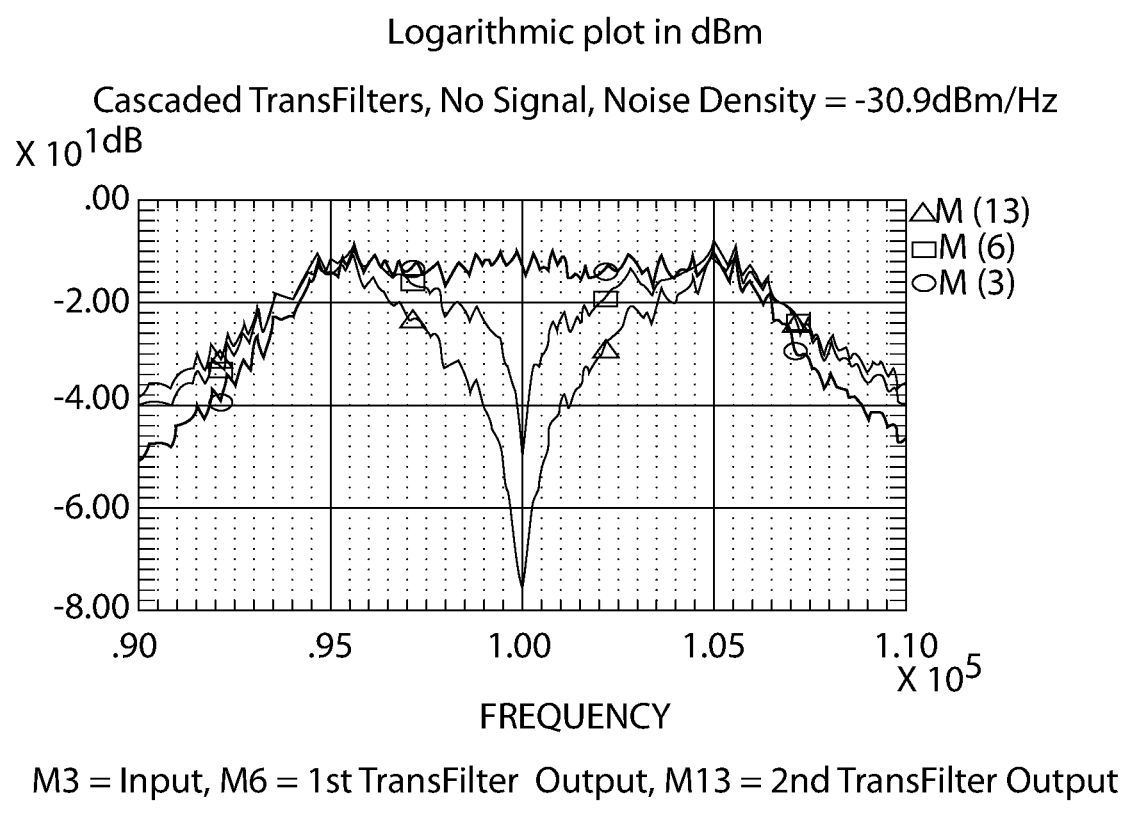
FIG. 11 is a diagram depicting the frequency spectrum at the outputs of two (by way of example only) cascaded trans-filters, showing the absence of the threshold.

By way of example only, this is demonstrated in the plots of FIG. 11 as well as FIGS. 16-23 where the in-band noise is shown as being progressively compressed (FIGS. 11, 16-19) as the output of one LTI trans-filter is passed through a second, a third, etc., LTI trans-filter while simultaneously, the signal impulse amplitudes progressively increase (FIGS. 20-23). As a result, the output signal-to-noise ratio (SNRo) of the LTI trans-filter is greater than the input signal-to-noise ratio (SNRi) of the exponentially-modulated signal.

The implications of this are profound. The Noise Figure (NF) quantity is well-known in communications theory and is defined as:

$$NF=10 \cdot \log(SNRi/SNRo) dB$$

Until now, the NF value has always been a positive number since the quantity SNRi/SNRo has always been greater than 1. However, using the filter system of the present invention, with the output signal-to-noise ratio (SNRo) being larger than the input signal-to-noise ratio (SNRi), the following relationship has now been established:

$$SNRi/SNRo<1$$

Thus, by definition of logarithms, the NF of such a relationship is a negative number. This has profound implications because what this means is that system receiver sensitivity is greatly improved relative to conventional "Matched Filter/Coherent detectors" whose NF is 0 dB at best. Moreover, as the trans-filters are cascaded, this increases system receiver sensitivity to the maximum, namely, NF=10 log (hF0/20 KTsB), where h=Planck's constant, $F_0$ is the carrier frequency (Hz), K is the Boltzman Constant, Ts is the system temperature (° K) and B is the bandwidth (Hz). Maximum receiver sensitivity (Ps) is then:

$$Ps=[-301.8+10 \cdot \log(F_0)] \text{ dBm}$$

$F_0$ can be selected to reduce path loss, increasing detection and tracking range. Trans-filter sensitivity can be traded off against antenna gain and transmit power and is not limited by system noise. The implications of this are that communications, control and radar receiver range can be increased by operation at lower frequency where path loss is lower even though system noise is greater since noise is selectively reduced by the trans-filter of the present application.

At the heart of every receiver is a detector circuit that recovers the signal information. Detector Noise Figure is a primary factor that determines system sensitivity: Ps=NF+ 10 Log(20 KTsB) dBm.

The Trans-Filter/Detector 20/120 and 220 reduces input noise prior to detection. This results in a negative noise figure: NF=10 Log({SNR}in/{SNR}out) dB. Since {SNR}out>{SNR} in NF is negative and this improves system sensitivity relative to Matched Filter/Coherent detectors whose noise figure is 0 dB at best.

Trans-Filter/Detectors 20/120 and 220 can be cascaded, thereby increasing system sensitivity to the maximum. Noise figure of the Trans-Filter/Detector cascade is then: NF=10 Log(hFo/20 KTsB) dB. Maximum system sensitivity is then: Ps=[−301.8+10 Log(F0)] dB. Where Fo=carrier frequency Hz. $F_0$ can be selected to reduce path loss, increasing detection and tracking range. Trans-Filter/Detector sensitivity can be traded off against antenna gain and transmit power and is not limited by system noise. Information bandwidth is limited to $F_o/2$ by the sampling theorem.

Communications, control and RADAR receiver range can be increased by operation at a lower frequency where path loss is lower even though system noise is greater, since noise is selectively reduced by the Trans-Filter/Detector 20/120 and 220. Matched Filter/Coherent Detectors cannot do this.

The Trans-Filter/Detector 20/120 and 220 transform exponential modulation directly to baseband without a mixer or Local Oscillator. The conversion is coherent and in the case of digital modulation it produces polarized pulses at bit transitions. The original bit stream is easily regenerated using the polarized pulses.

Stationary waveforms such AWGN are reduced by cancellation.

Trans-Filter/Detectors 20/120 and 220 are Linear-Time-Invariant circuits and may be cascaded, increasing in-band noise reduction and enhancing digital signals with each added stage. RADAR range can be maximized by Trans-Filter/Detector 20/120 and 220 negative NF and by operation at lower frequency where path loss is lower. Combining coherent Trans-Filter/Detector outputs from multiple receivers also increases pre-detection (SNR) and system sensitivity.

Increased sensitivity can compensate for lower antenna gain due to lower operating frequency.

Direct coherent conversion of multiple received signals to baseband from multiple small terminals with stationary low gain antennas and cascaded Trans-Filter/Detectors 20/120 and 220 can be used as elements in a large array.

The coherent baseband output signals can be combined, improving the detected (SNR) by 10 Log (N×Gi) where N is the number of nodes in the array and Gi is the antenna gain of each small antenna.

Power amplifiers can be included at each node to provide the transmitted RADAR signal. The effective transmit gain of the array will be 20 Log(N×Gi).

Oscillator Phase Noise Reduction Using the Trans-Filters 20/120 and 220

The following system and method of reducing oscillator phase noise relies upon negative feed-back of only the oscillator phase noise, not the AM, envelope or stationary noise. This requires a detector circuit whose output is proportional to only the phase or frequency variations of the oscillator and suppresses amplitude variations. This is the unique characteristic of the Trans-Filter/Detector 20, 120 or 220.

The oscillator output drives a Trans-Filter/Detector 20, 120 or 220 whose output is the oscillator residual phase noise. The residual phase noise is amplified and applied to the frequency control input of the oscillator, reducing the oscillator phase noise. A compensation network is used to stabilize the negative feed-back loop.

Oscillators are basically noise correlators. The thermal noise generated in the components that constitute the oscillator circuit is amplified, spectrally-shaped and fed back, increasing the output until a limit is reached. Nonlinearity in the circuit determines the limit, otherwise the oscillations would increase in amplitude to destruction.

The Q factor of the resonant structure in the feed-back path determines the frequency, stability and residual phase noise of the oscillator. Variation of a bias or reactive component value allows the frequency of the oscillator to be adjusted. Presence of such a frequency control port is necessary to reduce residual phase noise via negative feed-back unless a phase modulator is placed between the oscillator and the input to the Trans-Filter 20, 120 or 220.

Oscillators start by amplification of Gaussian noise (AWGN) that is shaped by a resonant circuit. AWGN consists of a wide band of frequencies with random amplitude distributions but there is no phase or frequency correlation between any of the noise components. The resonant circuit passes a restricted band of noise and the oscillations build up in amplitude and are sustained.

If negative feed-back is introduced that contains the AWGN, it may prevent the oscillations from building up, introducing an instability. The negative feed-back should contain only the residual phase variations.

As the amplitude of the oscillation builds up, the larger frequency components tend to suppress the smaller ones. This is due to the increasing nonlinearity of the amplifier as the signal approaches the limit. This also causes the band of frequencies that determine the oscillator frequency to shrink.

Oscillator frequency is not a single spectral line, but the weighted average of all of the oscillator spectral lines. The normalized amplitude of each spectral line times the line frequency is averaged to produce the output frequency. It should be noted that the mean of the sum of all of the products, [(spectral line Frequency)×Magnitude of the line] is the oscillator frequency. This is the First Moment or instantaneous frequency of the oscillator. It changes randomly with time producing the residual phase modulation. A single spectral line with the same time varying moment is the equivalent of all of the spectral lines.

Gaussian noise is a stationary function. Each bin or frequency slice of noise is uncorrelated to any other bin. There is no exponential modulation component in Gaussian noise. It should be noted that AWGN can be expressed using the general equation of a wave in the form of a summation as follows:

$g(\omega,t)=\Sigma A\omega(t)e^{i\omega t}$ where $A\omega(t)$ is a Gaussian magnitude variable (Does not change sign), and $e^{i\omega t}$ is an incremental constant (a constant at each new incremental frequency).

The phasor diagram at any frequency bin, $F \pm n\gamma$ has only magnitude variations that are uncorrelated to the magnitude variations of any other frequency bin. This is due to the synchronism between the $A\omega(t)\cos(\omega t)$ and $A\omega(t)\sin(\omega t)$. Only the magnitude of the phasor at each frequency $(F \pm n\Delta)$ varies.

There is however, an instantaneous random amplitude variation of each noise bin, relative to all others. The noise bins are distributed over the shape of the resonant structure. When noise bins above and below the center of the band have random amplitude variations relative to each other that are of opposite sign, they cause the instantaneous frequency to shift. This phenomenon results in AM-to-PM conversion that produces the random phase modulation in oscillator circuits.

Oscillators use the random Amplitude variation of their internal Gaussian noise sources to generate residual phase noise. This AM-to-PM conversion can be mitigated if the oscillator output phase noise can be separated from the output AM noise and fed back to a frequency control port of the oscillator to cancel or reduce the phase noise. The Trans-Filter 20, 120 or 220 provides a means to accomplish this.

The Importance of the Trans-Filter 20, 120 or 220 in the Phase Noise Reduction The ability to reduce phase noise by negative feed-back is dependent upon the ability to detect only the oscillator output phase noise, independent of output AM noise.

The Trans-Filter/Detector 20, 120 or 220 is the only known detector that distinguishes between AM and Phase Noise and can selectively reduce AM noise.

The derivative nature of the Trans-Filter's 20, 120, 220 Transfer Function (dV/dF) and its ability to reduce in-band stationary noise makes it the ideal detector of oscillator residual phase noise. While AWGN is rejected by 30 dB or more at Fo, oscillator phase noise (dF/dt) is detected by the Trans-Filter slope (dV/dF) with minimum loss. The Trans-Filter 20, 120, 220 output is then (dV/dt)=(dF/dt)×(dV/dF) the phase noise voltage.

The phase noise can then be applied to the oscillator circuit to reduce itself using negative feed-back. Other types of detectors fold the oscillator spectrum and cannot be used.

There are two ways to use negative feed-back to improve Oscillator phase noise:
  (a) The first way is to incorporate the phase noise reduction loop in the primary oscillator circuit.
  (b) The second way is to provide an entirely independent module that corrects phase noise of an off-set oscillator or injects cancelling phase modulation using a phase modulator. This source introduces phase deviations that counteract random phase deviations in both the primary and off-set oscillators.

Phase noise introduced by mechanical shock and vibration can also be reduced using negative feed-back. Motion sensors and acceleration monitors are not necessary. The phase shifts introduced by mechanical shock or vibration are detected and fed back to reduce their magnitude using negative feed-back in either of the two methods indicated above.

Oscillator phase noise must be amplified and fed back out of phase to force inherent output phase noise to be reduced. AM noise must not be amplified along with the output phase noise and fed back out of phase as it would result in the previously mentioned problem.

Reduction of Phase Noise in Precision Oscillators

The more precise the oscillator frequency, the more important the residual phase or frequency noise component becomes, because it limits instantaneous absolute accuracy. Oscillator phase noise is detected, amplified and fed back (e.g., to a phase modulator, or to a fine-frequency control port of the oscillator, etc.) to oppose and reduce the incidental phase modulation. The derivative of the oscillator frequency is detected while rejecting the AM or envelope modulation components.

The oscillator residual phase modulation is detected using a Trans-Filter/Detector 20, 120 or 220 whose output is proportional to oscillator phase/frequency variations while reducing output due to Amplitude or envelope variations. This is a unique feature of the Trans-Filter/Detector 20, 120 or 220 that enables the selective reduction of oscillator residual phase noise.

Manufacturers of precision oscillators will be able to improve Phase Noise performance of their products by incorporating Trans-Filter/Detectors 20, 120 or 220. Many users of precision oscillators with critical applications requiring instantaneous frequency measurement with greater accuracy will also benefit from lower residual phase noise.

Thus, in summary, residual phase noise may be reduced in any precision oscillator with an auxiliary fine frequency control port, or via a phase modulator, etc.

Residual phase noise may be detected in any precision oscillator independently from residual AM or envelope noise by the Trans-Filter/Detector 20, 120 or 220.

Residual phase noise in any oscillator may be reduced using negative feed-back of the phase noise with reduced envelope noise using the Trans-Filter/Detector 20, 120 or 220.

Figure 34:
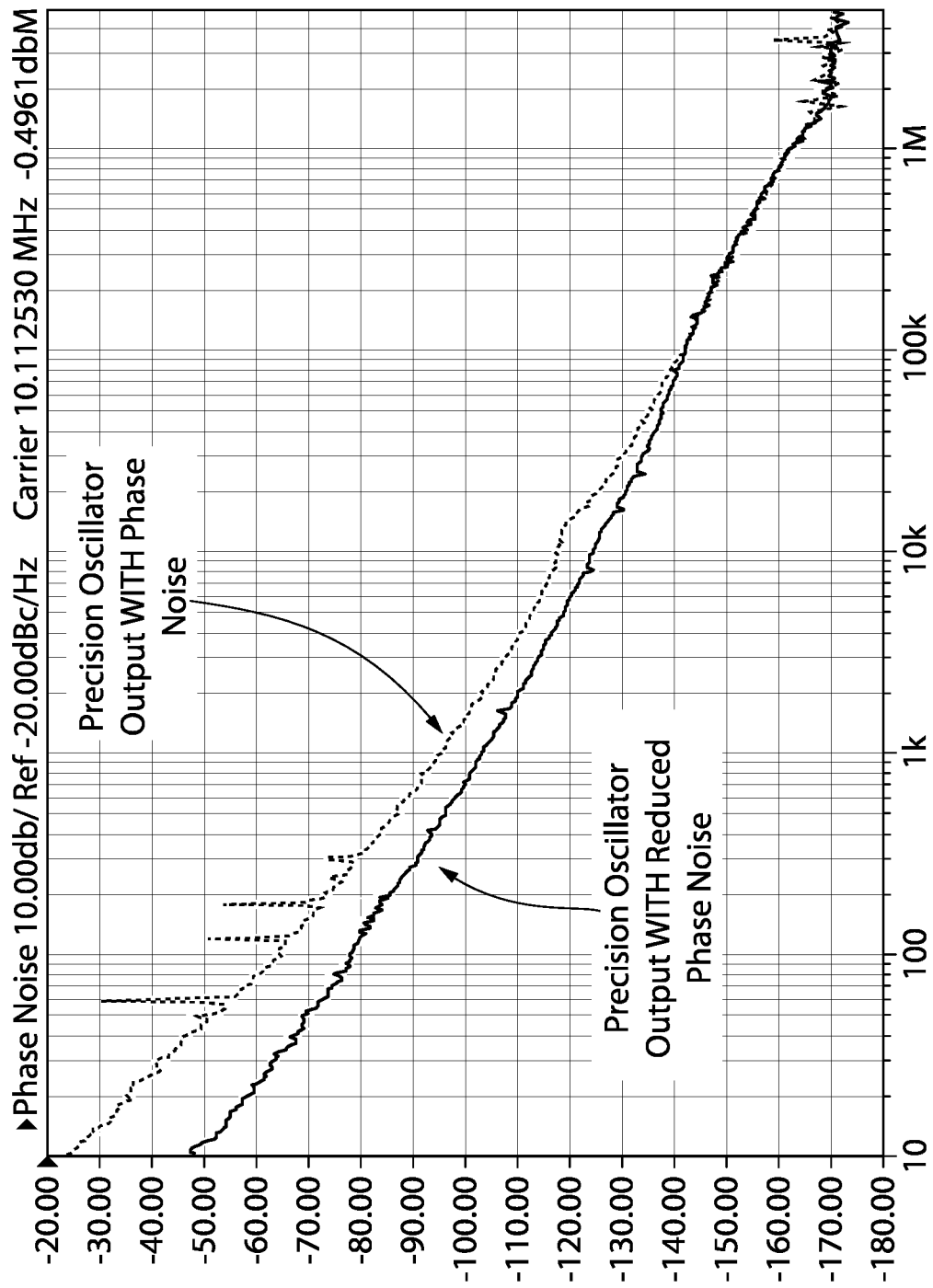
FIG. 34 depicts the phase noise reduction of a precision oscillator output using an oscillator phase noise reduction system implementing a trans-filter therein.

FIG. 34 depicts the significant phase noise reduction of a precision oscillator output using an oscillator phase noise reduction system implementing a Trans-Filter/Detector 20, 120 or 220 therein. As discussed above, the Trans-Filter/Detector 20, 120 or 220 sense minute variations of the signal phase and rejects variations in amplitude. Moreover, the Trans-Filter/Detector 20, 120 or 220 does not delay the detection process by more than a fraction of the oscillator period.

Figure 34A:
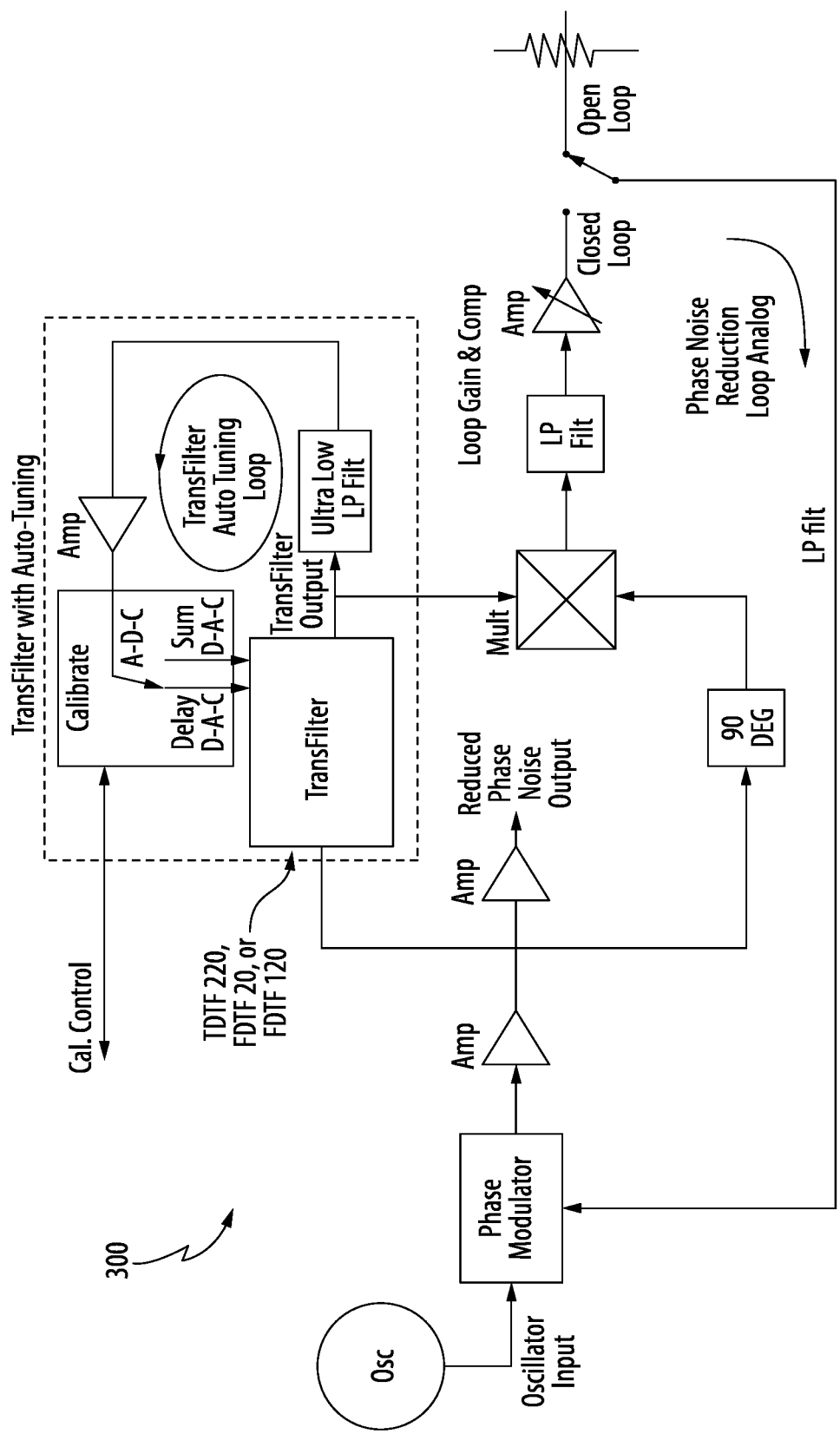
FIG. 34A is a block diagram of an oscillator phase noise reduction system using the trans-filter of the present invention in a negative feedback configuration.
Figure 34B:
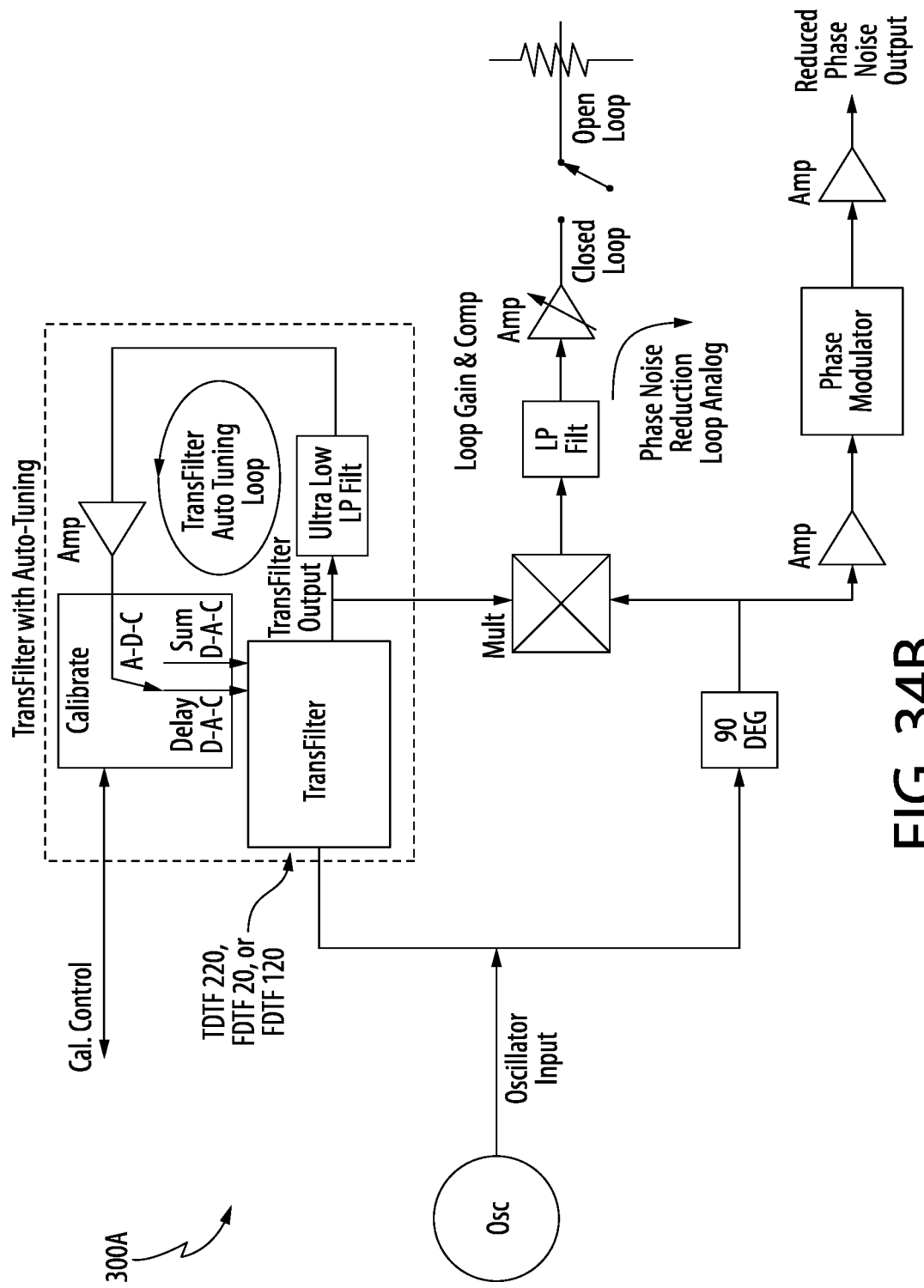
FIG. 34B is a block diagram of an oscillator phase noise reduction system using the trans-filter of the present invention in a feed forward configuration.

In view of all of the foregoing, it should be noted that the combination of all of these characteristics makes the Trans-Filter detectors 20/120 and 220 the ideal sensors to detect and reduce oscillator phase noise. To that end, FIG. 34A depicts an exemplary oscillator phase noise reduction (OPNR) block diagram 300 using the Trans-Filter with a negative feedback correction loop. FIG. 34B depicts an exemplary oscillator phase noise reduction block diagram 300A using the Trans-Filter with a feed forward correction loop. It should be noted any of the fore-described Trans-Filters 20, 120 or 220 can be used with either of these OPNR circuits and that of the two OPNR circuits, the negative feedback correction loop (FIG. 34) is the more preferred of the two OPNRs.

In particular, as shown in FIG. 34A, a Trans-Filter 20, 120 or 220 is provided as part of an auto-tuning circuit (shown) in the hatched line; the auto-tuning circuit provides a mechanism for the Trans-Filter to consistently verify that it is tuned to the oscillator frequency of a precision oscillator (OSC) whose phase noise is being reduced; a calibration controller toggles a Delay DAC with a Sum DAC to effect the continuous tuning. As can be seen the output of the Trans-Filter 20, 120 or 220 is fed to a multiplier (Mult) which is multiplied with an amplified 90 degree phased-shifted oscillator output signal. This multiplied signal is fed back to a phase modulator that minimizes or eliminates the amplitude modulated (AM) noise of the oscillator OSC output, thereby revealing the phase noise of the oscillator. A switch is provided that allows the user to view the oscillator output without the feedback ("open loop") as well as with the feedback.

The alternative OPNR block diagram 300A of FIG. 34B operates using the same components but uses a "feed forward" command scheme to reduce the phase noise of the precision oscillator OSC.

While the invention has been described in detail and with reference to specific examples thereof, it will be apparent to one skilled in the art that various changes and modifications can be made therein without departing from the spirit and scope thereof.

What is claimed is:

1. A system for reducing the residual phase noise, that limits the performance, of a precision oscillator having an oscillator output signal having an output frequency ($F_O$) and comprising residual amplitude modulated (AM) noise and residual phase noise, said system comprising:

a phase modulator into which the oscillator output signal is fed, said phase modulator reducing the residual phase modulation on the oscillator output signal based upon a negative feedback signal to form a reduced residual phase modulated output signal;

a linear-time invariant (LTI) filter, receiving said reduced residual phase modulated output signal therein, that equally splits said reduced residual phase modulated output signal into two paths whose outputs are shifted by 180 degrees relative to each other and are summed, thereby notching out the oscillator output frequency ($F_O$) and transforming only the reduced residual phase noise modulated portion of said oscillator output signal with reduced residual phase noise output thereby forming an LTI output signal which forms a first input signal to a multiplier;

a 90 degree (at $F_O$) phase shifter for producing a phase shifted output of said oscillator output signal with reduced residual phase noise forming a second input signal to said multiplier;

said multiplier multiplying said first input signal with said second input signal so as to multiply said 90 degree shifted output of said oscillator output signal with said LTI output signal, thereby producing a baseband replica of the oscillator output signal with reduced phase modulation which is then fed through amplification and compensation to form a negative feedback signal, said negative feedback signal being applied to said phase modulator to reduce the oscillator phase noise; and an auto-tuning circuit that continuously tunes said LTI filter to the oscillator output signal frequency ($F_O$).

2. The phase noise reduction system of claim 1 wherein at least one of said two paths comprises a time delay for delaying the phase modulated output signal passing therethrough, each of said two paths comprising a respective output signal and wherein said respective output signals are delayed in time from each other by a predetermined parameter, said two paths and said time delay comprising only linear components, said linear components minimizing a threshold that is normally present in exponentially-modulated signal demodulators.

3. The phase noise reduction system of claim 1 wherein said two paths split said phase modulated output signal into two paths shifted by an odd multiple of 180 degrees to notch out the AM noise and to form said LTI output signal.

4. A method for reducing the phase noise, that limits the performance, of a precision oscillator having an oscillator output signal having an output frequency ($F_O$) and comprising residual amplitude modulated (AM) noise and residual phase noise, said method comprising:

feeding the oscillator output signal into a phase modulator wherein said phase modulator reduces the residual phase modulation on the oscillator output signal based upon a negative feedback signal to form a reduced residual phase modulated output signal;

feeding said reduced residual phase modulated output signal into a linear-time invariant (LTI) filter which equally splits said reduced residual phase modulated output signal into two paths whose outputs are shifted by 180 degrees relative to each other and are summed, thereby notching out the oscillator output frequency ($F_O$) and transforming only the reduced residual phase noise modulated portion of said oscillator output signal with reduced residual phase noise output, thereby forming an LTI output signal which forms a first input signal to a multiplier;

using a 90 phase shifter to produce a phase shifted output of said oscillator output signal with reduced residual phase noise to form a second input signal to said multiplier;

multiplying said first input signal with said second input signal in said multiplier so as to multiply said 90 degree shifted output of said oscillator output signal with said LTI output signal, thereby producing a baseband replica of the oscillator output signal with reduced phase modulation and then feeding said baseband replica of the oscillator output signal through amplification and compensation to form a negative feedback signal, said negative feedback signal being applied to said phase modulator to reduce the oscillator phase noise; and auto-tuning said LTI filter to continuously tune said LTI filter to the oscillator output signal frequency ($F_o$).

5. The method of claim 4 wherein at least one of said two paths comprises a time delay for delaying the phase modulated output signal passing therethrough, each of said two paths comprising a respective output signal and wherein said respective output signals are delayed in time from each other by a predetermined parameter, said two paths and said time delay comprising only linear components, said linear components minimizing a threshold that is normally present in exponentially-modulated signal demodulators.

6. The method of claim 4 wherein said two paths split said phase modulated output signal into two paths shifted by an odd multiple of 180 degrees to notch out the AM noise and to form said LTI output signal.

* * * * *